United States Patent
Kinoshita

(10) Patent No.: US 12,336,176 B2
(45) Date of Patent: Jun. 17, 2025

(54) SEMICONDUCTOR MEMORY DEVICE

(71) Applicant: Kioxia Corporation, Tokyo (JP)

(72) Inventor: Shigeru Kinoshita, Yokohama (JP)

(73) Assignee: Kioxia Corporation, Tokyo (JP)

( * ) Notice: Subject to any disclaimer, the term of this patent is extended or adjusted under 35 U.S.C. 154(b) by 883 days.

(21) Appl. No.: 17/408,938

(22) Filed: Aug. 23, 2021

(65) Prior Publication Data

US 2022/0293620 A1    Sep. 15, 2022

(30) Foreign Application Priority Data

Mar. 12, 2021    (JP) ................................. 2021-040583

(51) Int. Cl.
| | |
|---|---|
| *H01L 23/528* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ............ *H10B 43/10* (2023.02); *H10B 41/10* (2023.02); *H10B 41/27* (2023.02); *H10B 43/27* (2023.02)

(58) Field of Classification Search
CPC ........ H10B 43/10; H10B 41/10; H10B 41/27; H10B 43/27; H10B 41/35; H10B 41/50; H10B 43/35; H10B 43/50
See application file for complete search history.

(56) References Cited

U.S. PATENT DOCUMENTS

| | | | |
|---|---|---|---|
| 9,929,174 B1* | 3/2018 | Mizutani | ................ H10B 43/35 |
| 10,043,816 B2 | 8/2018 | Taekyung et al. | |
| 10,074,665 B2 | 9/2018 | Kawaguchi et al. | |
| 10,546,868 B2 | 1/2020 | Kinoshita | |
| 10,692,876 B2 | 6/2020 | Okawa | |
| 2018/0019253 A1* | 1/2018 | Kinoshita | .............. H10B 41/27 |
| 2020/0295031 A1* | 9/2020 | Lue | ................... H01L 21/76224 |

FOREIGN PATENT DOCUMENTS

| | | |
|---|---|---|
| JP | 2020-43211 A | 3/2020 |
| JP | 6656104 B2 | 3/2020 |

* cited by examiner

*Primary Examiner* — Samuel Park
(74) *Attorney, Agent, or Firm* — Oblon, McClelland, Maier & Neustadt, L.L.P.

(57) ABSTRACT

A semiconductor memory device comprises: a first conductive and second conductive layers extending in a first direction; and first and second semiconductor column rows aligned in a second direction. The first semiconductor column rows each comprise first semiconductor columns aligned in the first direction and facing the first conductive layer. The second semiconductor column rows each comprise second semiconductor columns aligned in the first direction and facing the second conductive layer. For example, a distance in the first direction between center positions of two of the first semiconductor columns adjacent in the first direction is assumed to be a first adjacent distance. In this case, a pitch in the second direction of the first semiconductor column rows is $\sqrt{3}/2$ or more times the first adjacent distance. Moreover, a pitch in the second direction of the second semiconductor column rows is less than $\sqrt{3}/2$ times the first adjacent distance.

18 Claims, 20 Drawing Sheets

SEMICONDUCTOR MEMORY DEVICE

CROSS-REFERENCE TO RELATED APPLICATIONS

This application is based upon and claims the benefit of Japanese Patent Application No. 2021-040583, filed on Mar. 12, 2021, the entire contents of which are incorporated herein by reference.

BACKGROUND

Field

Embodiments relate to a semiconductor memory device.

Description of the Related Art

There is known a semiconductor memory device comprising: a substrate; a plurality of gate electrodes stacked in a direction intersecting a surface of this substrate; a semiconductor layer facing these plurality of gate electrodes; and a gate insulating layer provided between the gate electrodes and the semiconductor layer. The gate insulating layer comprises a memory portion capable of storing data, such as an insulating charge accumulating layer of the likes of silicon nitride (SiN) or a conductive charge accumulating layer of the likes of a floating gate, for example.

DETAILED DESCRIPTION

Figure 1:
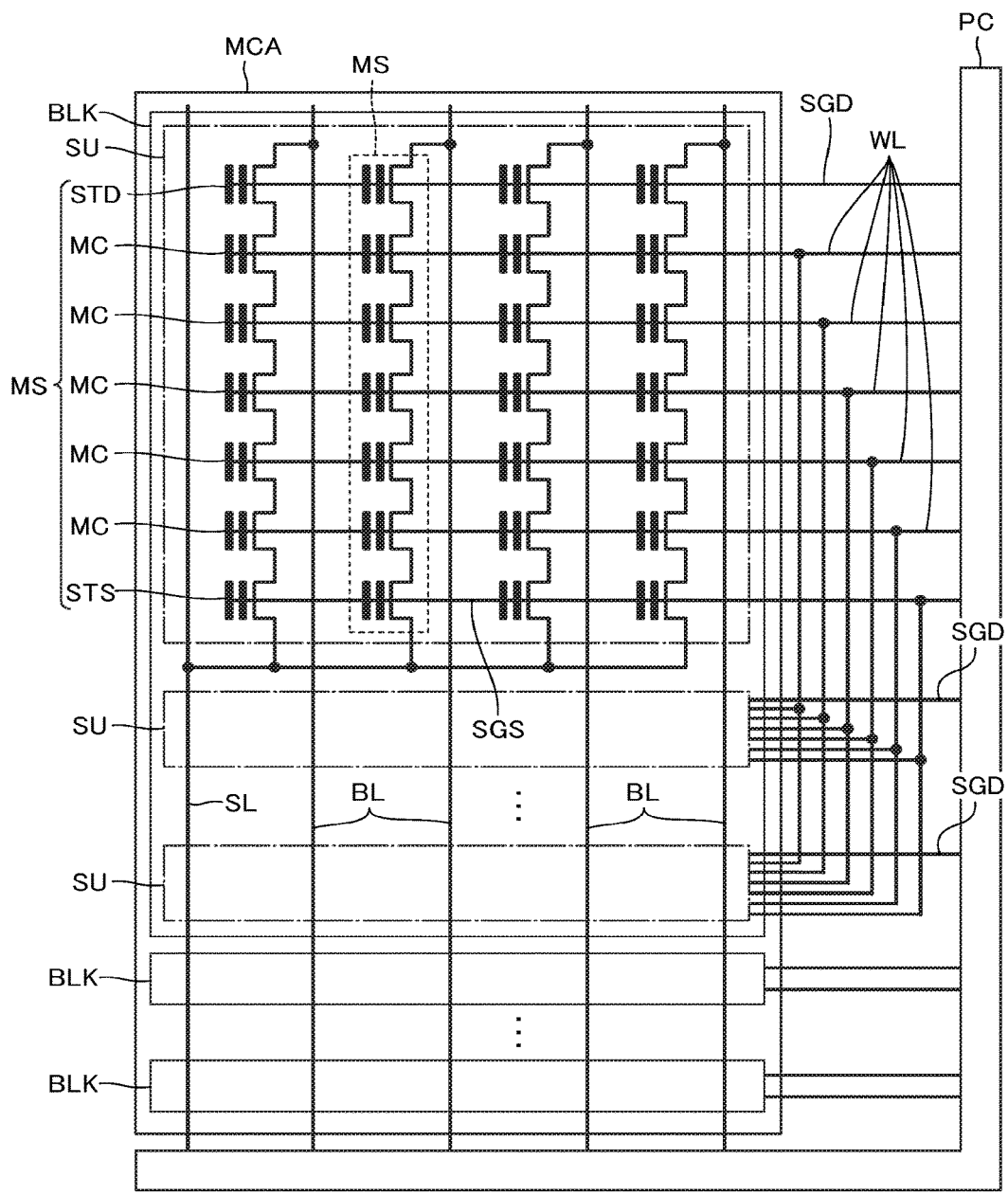
FIG. 1 is a schematic circuit diagram showing some of configurations of a semiconductor memory device according to a first embodiment.

A semiconductor memory device according to an embodiment comprises: a first conductive layer extending in a first direction; a second conductive layer extending in the first direction, the second conductive layer being aligned with the first conductive layer in a second direction intersecting the first direction; a plurality of first semiconductor column rows aligned in the second direction; and a plurality of second semiconductor column rows aligned in the second direction. The plurality of first semiconductor column rows each comprise a plurality of first semiconductor columns aligned in the first direction. The plurality of first semiconductor columns each face the first conductive layer. The plurality of second semiconductor column rows each comprise a plurality of second semiconductor columns aligned in the first direction. The plurality of second semiconductor columns each face the second conductive layer. A cross section extending in the first direction and the second direction and including the first conductive layer and the second conductive layer is assumed to be a first cross section. Moreover, a distance in the first direction between center positions in the first cross section of two of the first semiconductor columns adjacent in the first direction is assumed to be a first adjacent distance. In this case, a pitch in the second direction of the plurality of first semiconductor column rows is $\sqrt{3}/2$ or more times the first adjacent distance. Moreover, a pitch in the second direction of the plurality of second semiconductor column rows is less than $\sqrt{3}/2$ times the first adjacent distance.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, a certain direction parallel to an upper surface of a substrate will be called an X direction, a direction parallel to the upper surface of the substrate and perpendicular to the X direction will be called a Y direction, and a direction perpendicular to the upper surface of the substrate will be called a Z direction.

Moreover, in the present specification, sometimes, a direction lying along a certain plane will be called a first direction, a direction intersecting the first direction along this certain plane will be called a second direction, and a direction intersecting this certain plane will be called a third direction. These first direction, second direction, and third direction may, but need not, correspond to any of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

FIG. 1 is a schematic circuit diagram showing some of configurations of a semiconductor memory device according to a first embodiment. The semiconductor memory device according to the first embodiment comprises a memory cell array MCA and a peripheral circuit PC.

The memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), and a source side select transistor STS. The drain side select transistor STD, the plurality of memory cells MC, and the source side select transistor STS are connected in series between the bit line BL and the source line SL. Hereafter, the drain side select transistor STD and the source side select transistor STS will sometimes simply be called select transistors (STD, STS).

The memory cell MC is a field effect type transistor. The memory cell MC comprises a semiconductor layer, a gate insulating film, and a gate electrode. The semiconductor layer functions as a channel region. The gate insulating film includes a charge accumulating film. A threshold voltage of the memory cell MC changes according to an amount of charge in the charge accumulating film. The memory cell MC stores 1 bit or a plurality of bits of data. Note that the gate electrodes of the plurality of memory cells MC corresponding to one memory string MS are respectively connected to word lines WL. These word lines WL are respectively commonly connected to all of the memory strings MS in one memory block BLK.

The select transistors (STD, STS) are field effect type transistors. The select transistors (STD, STS) each comprise a semiconductor layer, a gate insulating film, and a gate electrode. The semiconductor layer functions as a channel region. The gate electrodes of the select transistors (STD, STS) are respectively connected with select gate lines (SGD, SGS). One drain side select gate line SGD is commonly connected to all of the memory strings MS in one string unit SU. One source side select gate line SGS is commonly connected to all of the memory strings MS in one memory block BLK.

The peripheral circuit PC comprises, for example: a voltage generating circuit that generates an operation voltage; a voltage transfer circuit that transfers the generated operation voltage to selected ones of the bit lines BL, word lines WL, source line SL, select gate lines (SGD, SGS), and so on; a sense amplifier module connected to the bit lines BL; and a sequencer that controls these voltage generating circuit, voltage transfer circuit, and sense amplifier module.

Figure 2:
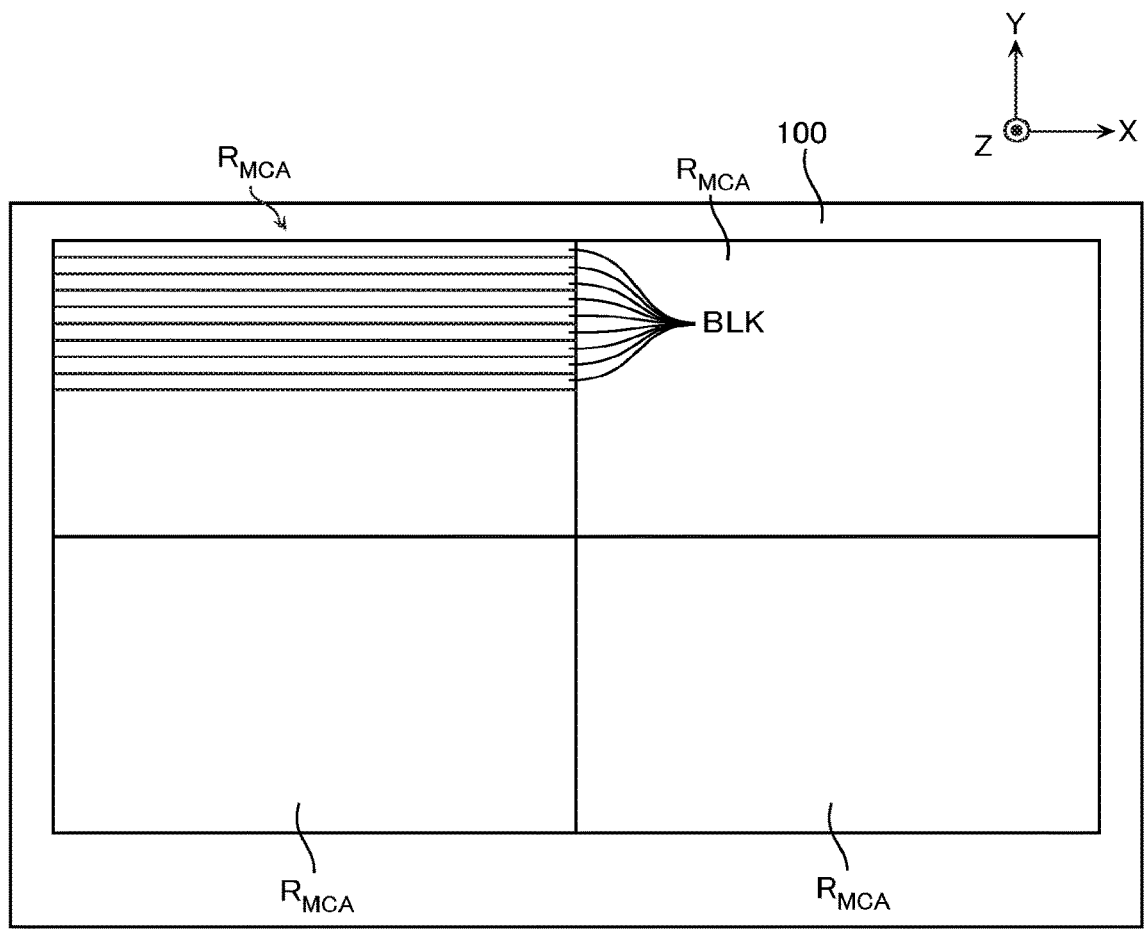
FIG. 2 is a schematic plan view showing some of configurations of same semiconductor memory device.

FIG. 2 is a schematic plan view showing some of configurations of the semiconductor memory device according to the first embodiment. The semiconductor memory device according to the present embodiment comprises a semiconductor substrate 100. The semiconductor substrate 100 is configured from P type silicon (Si) including a P type impurity such as boron (B), for example. In the example illustrated, the semiconductor substrate 100 is provided with four memory cell array regions $R_{MCA}$ aligned in the X direction and the Y direction. Moreover, each of the memory cell array regions $R_{MCA}$ is provided with a plurality of the memory blocks BLK aligned in the Y direction.

Figure 3:
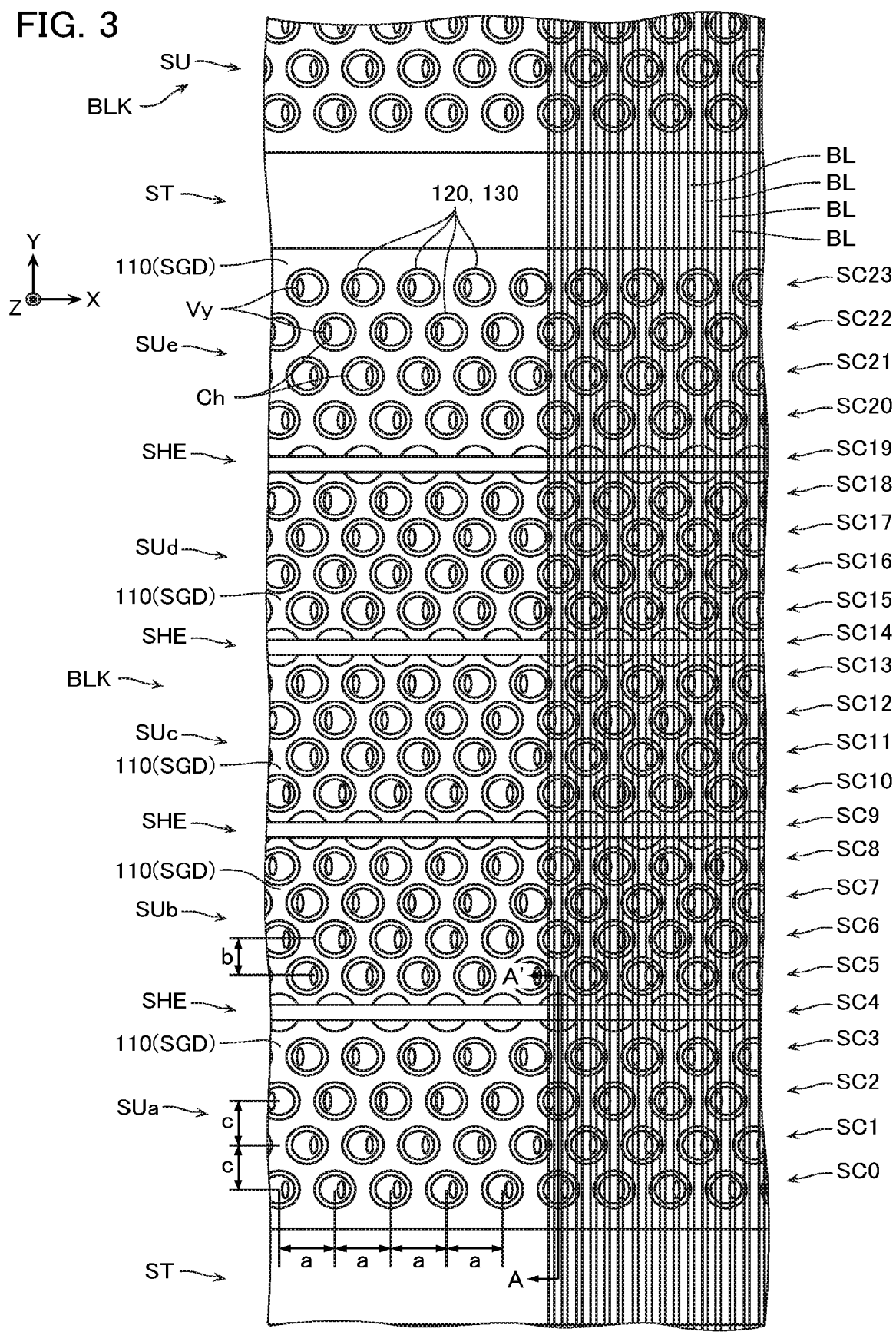
FIG. 3 is a schematic plan view in which part of FIG. 2 is shown enlarged.
Figure 4:
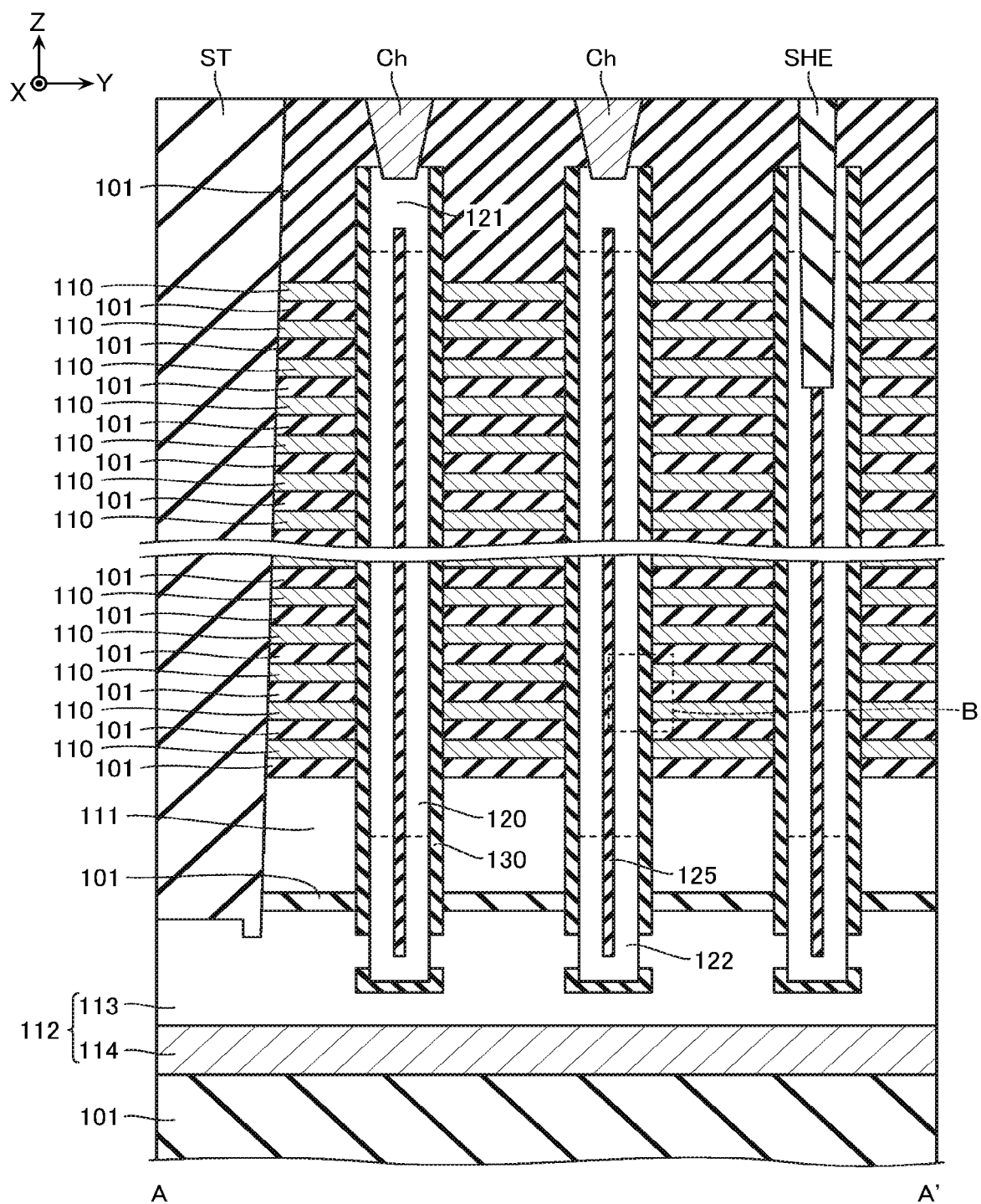
FIG. 4 is a schematic cross-sectional view in which the structure shown in FIG. 3 has been cut along the line A-A' and viewed along a direction of the arrows.
Figure 5:
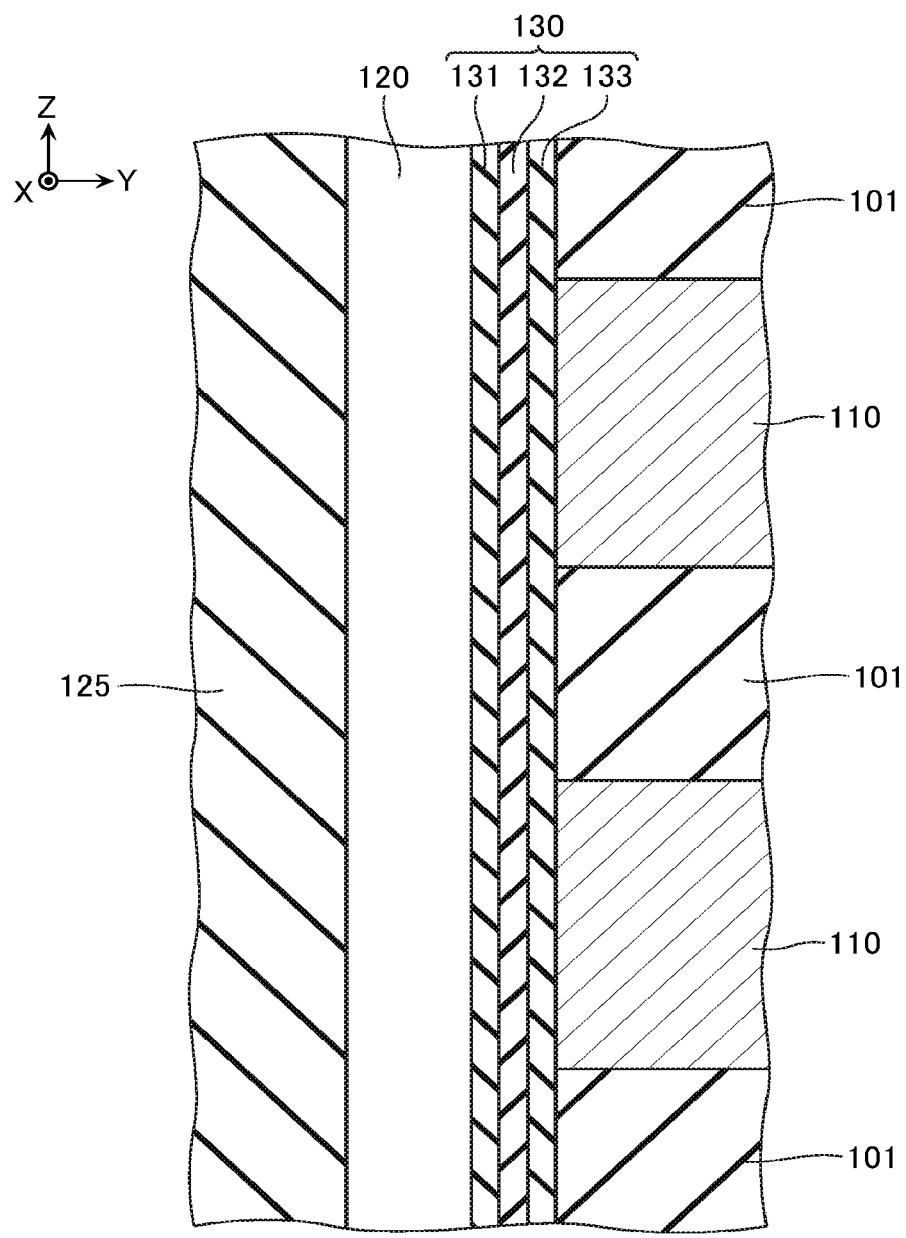
FIG. 5 is a schematic cross-sectional view in which the portion indicated by B in FIG. 4 is shown enlarged.

FIG. 3 is a schematic plan view in which part of FIG. 2 is shown enlarged. FIG. 4 is a schematic cross-sectional view in which the structure shown in FIG. 3 has been cut along the line A-A' and viewed along a direction of the arrows. FIG. 5 is a schematic cross-sectional view in which the portion indicated by B in FIG. 4 is shown enlarged.

In the example of FIG. 3, the memory block BLK comprises five string units SUa-SUe provided from one side in the Y direction (a negative side in the Y direction in FIG. 3) to the other side in the Y direction (a positive side in the Y direction in FIG. 3). These plurality of string units SUa-SUe each correspond to the string unit SU described with reference to FIG. 1. An inter-string unit insulating layer SHE of the likes of silicon oxide ($SiO_2$) is provided between two string units SU adjacent in the Y direction. An inter-block insulating layer ST of the likes of silicon oxide ($SiO_2$) is provided between two memory blocks BLK adjacent in the Y direction.

As shown in FIG. 4, the memory block BLK comprises: a plurality of conductive layers 110 aligned in the Z direction; a plurality of semiconductor columns 120 extending in the Z direction; and a plurality of gate insulating films 130 respectively provided between the plurality of conductive layers 110 and the plurality of semiconductor columns 120.

The conductive layer 110 is a substantially plate-like conductive layer extending in the X direction. The conductive layer 110 may include a stacked film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. Insulating layers 101 of the likes of silicon oxide ($SiO_2$) are respectively provided between two conductive layers 110 adjacent in the Z direction among the plurality of conductive layers 110 aligned in the Z direction.

A conductive layer 111 is provided below the conductive layers 110. The conductive layer 111 may include the likes of polycrystalline silicon including an impurity such as phosphorus (P) or boron (B), for example. Moreover, an insulating layer 101 of the likes of silicon oxide ($SiO_2$) is provided between the conductive layer 111 and the conductive layers 110.

A conductive layer 112 is provided below the conductive layer 111. The conductive layer 112 comprises: a semiconductor layer 113 connected to a lower end of the semiconductor column 120; and a conductive layer 114 connected to a lower surface of the semiconductor layer 113. The semiconductor layer 113 may include the likes of polycrystalline silicon including an impurity such as phosphorus (P) or boron (B), for example. The conductive layer 114 may include a conductive layer of a metal such as tungsten (W), or conductive layer of tungsten silicide, and so on, or may include another conductive layer, for example. Moreover, the insulating layer 101 of the likes of silicon oxide ($SiO_2$) is provided between the conductive layer 112 and the conductive layer 111.

The conductive layer 112 functions as the source line SL (FIG. 1). The source line SL is commonly provided for all of the memory blocks BLK included in the memory cell array region $R_{MCA}$ (FIG. 2), for example.

The conductive layer 111 functions as the source side select gate line SGS (FIG. 1) and as the gate electrodes of the plurality of source side select transistors STS (FIG. 1) connected to this source side select gate line SGS. The conductive layer 111 is electrically independent every memory block BLK.

Moreover, the plurality of conductive layers 110 function as the word lines WL (FIG. 1) and as the gate electrodes of the pluralities of memory cells MC (FIG. 1) connected to these word lines WL. These plurality of conductive layers 110 are each electrically independent every memory block BLK.

Moreover, one or a plurality of the conductive layers 110 positioned more upwardly than these word line WL-functioning conductive layers 110 function as the drain side select gate line SGD (FIG. 1) and as the gate electrodes of the plurality of drain side select transistors STD (FIG. 1) connected to this drain side select gate line SGD. These plurality of conductive layers 110 have a smaller width in the Y direction than the other conductive layers 110. Moreover, the inter-string unit insulating layer SHE is provided between twos of these pluralities of conductive layers 110 adjacent in the Y direction. These plurality of conductive layers 110 are each electrically independent every string unit SU.

The semiconductor column 120 is a semiconductor layer of the likes of polycrystalline silicon (Si), for example. As shown in FIG. 4, for example, the semiconductor column 120 has a substantially cylindrical shape, and has its central portion provided with an insulating layer 125 of the likes of silicon oxide. Moreover, an outer peripheral surface of the semiconductor column 120 is surrounded by respective ones of the conductive layers 110, 111, and faces the conductive layers 110.

An upper end portion of the semiconductor column 120 is provided with an impurity region 121 that includes an N type impurity of the likes of phosphorus (P). In the example of FIG. 4, a boundary line of the upper end portion of the semiconductor column 120 and a lower end portion of the impurity region 121 is indicated by a broken line. The impurity region 121 is connected to the bit line BL via a contact Ch and a contact Vy (FIG. 3).

A lower end portion of the semiconductor column 120 is provided with an impurity region 122 that includes an N type impurity of the likes of phosphorus (P). In the example of FIG. 4, a boundary line of the lower end portion of the semiconductor column 120 and an upper end portion of the impurity region 122 is indicated by a broken line. The impurity region 122 is connected to the semiconductor layer 113 of the above-described conductive layer 112. A portion positioned directly above the impurity region 122, of the semiconductor column 120 functions as the channel region of the source side select transistor STS. An outer peripheral surface of the impurity region 122 is surrounded by the conductive layer 111 and faces the conductive layer 111.

Note that as shown in FIG. 3, for example, the semiconductor columns 120 are aligned in a certain pattern in the X direction and the Y direction. For example, the memory block BLK comprises 24 semiconductor column rows SC0-SC23 provided from the one side in the Y direction to the other side in the Y direction. These 24 semiconductor column rows SC0-SC23 each comprise a plurality of the semiconductor columns 120 aligned in the X direction.

The semiconductor column rows SC0-SC3 correspond to the string unit SUa. The semiconductor columns 120 in the semiconductor column rows SC0-SC3 respectively function as the channel regions of the plurality of memory cells MC and the select transistors (STD, STS) included in the single memory strings MS (FIG. 1) in the string unit SUa. In FIG. 3, the outer peripheral surfaces of these plurality of semiconductor columns 120 are surrounded by the conductive layers 110 functioning as the drain side select gate line SGD corresponding to the string unit SUa.

Similarly, the semiconductor column rows SC5-SC8, the semiconductor column rows SC10-SC13, the semiconductor column rows SC15-SC18, and the semiconductor column rows SC20-SC23 respectively correspond to the string units SUb-SUe. The semiconductor columns 120 included in these semiconductor column rows SC respectively function as the channel regions of the plurality of memory cells MC and the select transistors (STD, STS) included in the single memory strings MS (FIG. 1) in the string units SUb-SUe. In FIG. 3, the outer peripheral surfaces of these plurality of semiconductor columns 120 are respectively surrounded by the conductive layers 110 functioning as the drain side select gate lines SGD corresponding to the string units SUb-SUe.

The semiconductor column rows SC4, SC9, SC14, SC19 are respectively provided between two string units SU aligned in the Y direction. These semiconductor column rows SC4, SC9, SC14, SC19 respectively overlap the inter-string unit insulating layers SHE looking from the Z direction. The semiconductor columns 120 included in these semiconductor column rows SC4, SC9, SC14, SC19 do not function either as the memory cells MC or as the select transistors (STD, STS). The outer peripheral surfaces of these plurality of semiconductor columns 120 each comprise: a region facing one of two conductive layers 110 functioning as the drain side select gate line SGD; and a region facing the other of the two conductive layers 110 functioning as the drain side select gate line SGD.

Moreover, in the example illustrated, in each of the semiconductor column rows SC0-SC23, the semiconductor columns 120 are aligned in the X direction with a pitch a. Moreover, a position in the X direction of the semiconductor column 120 included in an odd-numbered semiconductor column row and a position in the X direction of the semiconductor column 120 included in an even-numbered semiconductor column row differ by a distance of ½ times (half) the pitch a. Moreover, the semiconductor column rows SC0-SC4 are aligned in the Y direction with a pitch c. The pitch c is approximately $\sqrt{3}/2$ times the pitch a. The pitch c may be equal to $\sqrt{3}/2$ times the pitch a. Moreover, the semiconductor column rows SC4-SC19 are aligned in the Y direction with a pitch b. The pitch b is smaller than $\sqrt{3}/2$ times the pitch a. Moreover, the semiconductor column rows SC19-SC23 are aligned in the Y direction with the pitch c.

Note that in the present specification, when the likes of a pitch of a plurality of the semiconductor columns 120 aligned in the X direction is referred to, this pitch can be defined by a variety of methods. It is possible by means of, for example, SEM, TEM, or the like that an XY cross section of the kind exemplified in FIG. 3 is observed, that, in this XY cross section, center positions of two semiconductor columns 120 adjacent in the X direction are measured, that a distance in the X direction between these two center positions is measured, and that this distance is assumed to be the pitch. Moreover, it is possible by means of, for example, SEM, TEM, or the like that an XY cross section of the kind exemplified in FIG. 3 is observed, that, in this XY cross section, center positions of a plurality of the semiconductor columns 120 consecutively aligned in the X direction are measured, and that an average value of a distance in the X direction of these plurality of center positions is assumed to be the pitch. Note that in such a case, there is no need for center positions of all of the semiconductor columns 120 consecutively aligned in the X direction to be measured.

Moreover, in the present specification, when the likes of a center position of the semiconductor column 120 is referred to, this center position can be defined by a variety of methods. It is possible by means of, for example, SEM, TEM, or the like that an XY cross section of the kind exemplified in FIG. 3 is observed, and that, in this XY cross section, a center point of a circumscribed circle of the semiconductor column 120 is assumed to be the center position, or a center of gravity on an image of the semiconductor column 120 is assumed to be the center position.

Moreover, in the present specification, when the likes of a pitch of a plurality of the semiconductor column rows aligned in the Y direction is referred to, this pitch can be defined by a variety of methods. It is possible by means of, for example, SEM, TEM, or the like that an XY cross section of the kind exemplified in FIG. 3 is observed, that, in this XY cross section, center positions in the Y direction of the plurality of semiconductor column rows of interest are measured, that distances between these plurality of center positions are measured, and that an average value of these plurality of distances is assumed to be the pitch.

Moreover, in the present specification, when the likes of a center position in the Y direction of the semiconductor column row is referred to, this center position can be defined by a variety of methods. It is possible by means of, for example, SEM, TEM, or the like that an XY cross section of the kind exemplified in FIG. 3 is observed, that, in this XY cross section, center positions in the Y direction of one or more of the semiconductor columns 120 included in the semiconductor column row of interest are measured, and that any of the center positions, an average value of a plurality of the center positions, or a median value of a plurality of the center positions is assumed to be the center position in the Y direction of the semiconductor column row.

The gate insulating film 130 has a substantially cylindrical shape covering the outer peripheral surface of the semiconductor column 120. As shown in FIG. 5, for example, the gate insulating film 130 comprises a tunnel insulating film 131, a charge accumulating film 132, and a block insulating film 133 that are stacked between the semiconductor column 120 and the conductive layers 110. The tunnel insulating film 131 and the block insulating film 133 are insulating films of the likes of silicon oxide ($SiO_2$), for example. The charge accumulating film 132 is a film capable of accumulating a charge, of the likes of silicon nitride (SiN), for example. The tunnel insulating film 131, the charge accumulating film 132, and the block insulating film 133 have substantially cylindrical shapes, and extend in the Z direction along the outer peripheral surface of the semiconductor column 120 excluding a contacting portion of the semiconductor column 120 and the semiconductor layer 113 (FIG. 4).

Note that FIG. 5 shows an example where the gate insulating film 130 comprises the charge accumulating film 132 of the likes of silicon nitride. However, the gate insulating film 130 may comprise a floating gate of the likes of polycrystalline silicon including an N type or P type impurity, for example.

[Manufacturing Method]

Next, a manufacturing method of the semiconductor memory device according to the first embodiment will be described with reference to FIGS. 6 to 14. FIGS. 6 to 11, and 13 are schematic cross-sectional views for explaining same manufacturing method, and each show a cross section corresponding to FIG. 4. FIGS. 12 and 14 are schematic plan views for explaining same manufacturing method, and each show a plane corresponding to FIG. 3.

When manufacturing the semiconductor memory device according to the first embodiment, first, the peripheral circuit PC (FIG. 1) is formed on the semiconductor substrate 100. In addition, the insulating layer 101 is formed above the peripheral circuit PC.

Figure 6:
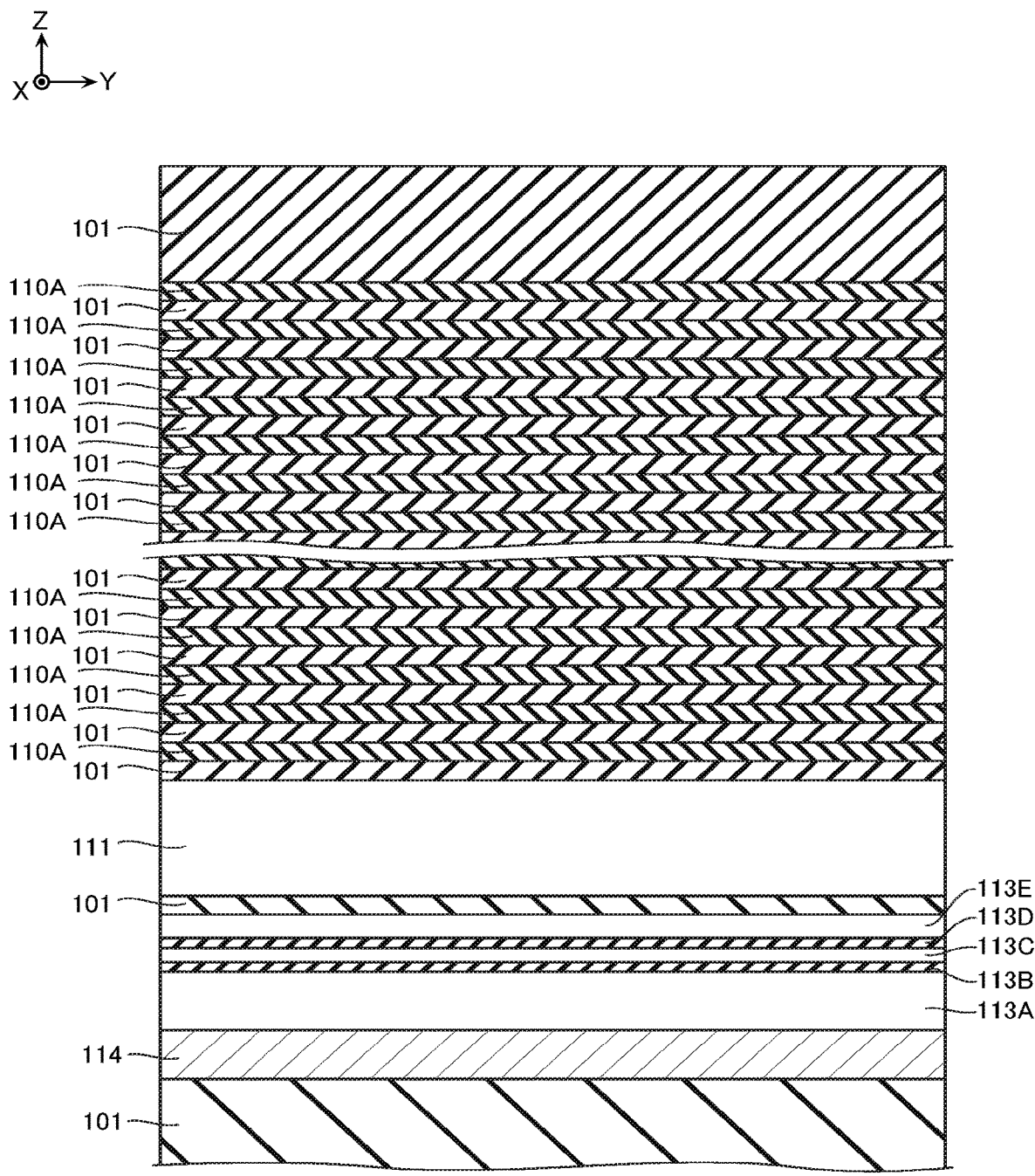
FIG. 6 is a schematic cross-sectional view for explaining a manufacturing method of same semiconductor memory device.

Next, as shown in FIG. 6, for example, the conductive layer 114, a semiconductor layer 113A of silicon or the like, a sacrifice layer 113B of silicon oxide or the like, a sacrifice layer 113C of silicon or the like, a sacrifice layer 113D of silicon oxide or the like, a semiconductor layer 113E of silicon or the like, the insulating layer 101, and the conductive layer 111 are formed on the insulating layer 101. In addition, a plurality of the insulating layers 101 and a plurality of sacrifice layers 110A are alternately formed. This step is performed by a method such as CVD (Chemical Vapor Deposition), for example.

Figure 7:
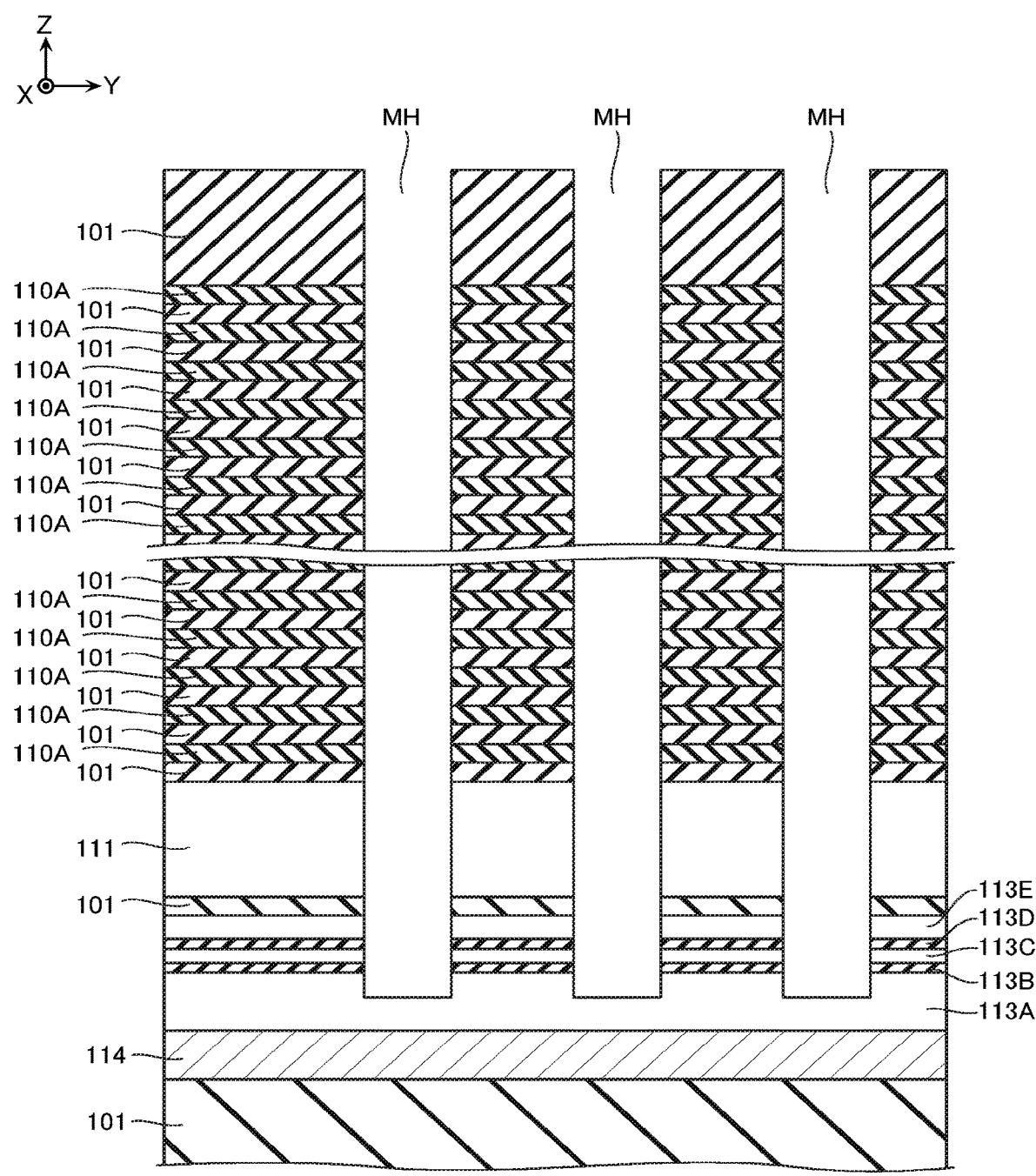
FIG. 7 is a schematic cross-sectional view for explaining same manufacturing method.

Next, as shown in FIG. 7, for example, a plurality of memory holes MH are formed at positions corresponding to the semiconductor columns 120. The memory hole MH is a through-hole that extends in the Z direction, penetrates the insulating layers 101 and sacrifice layers 110A, the conductive layer 111, the semiconductor layer 113E, the sacrifice layer 113D, the sacrifice layer 113C, and the sacrifice layer 113B, and exposes an upper surface of the semiconductor layer 113A. This step is performed by a method such as RIE (Reactive Ion Etching), for example.

Figure 8:
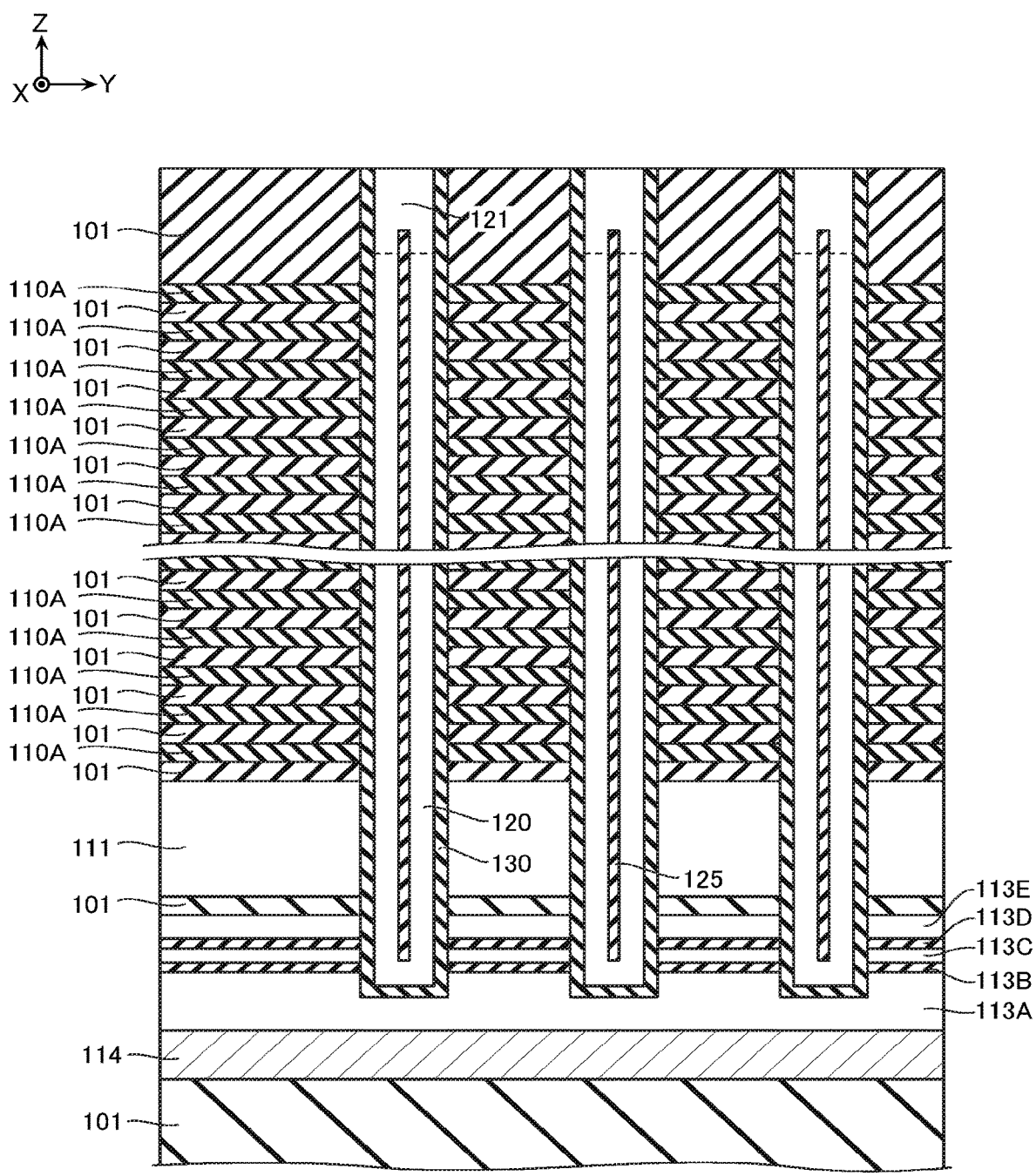
FIG. 8 is a schematic cross-sectional view for explaining same manufacturing method.

Next, as shown in FIG. 8, for example, the gate insulating film 130, the semiconductor column 120, the insulating layer 125, and the impurity region 121 are formed inside the memory hole MH. This step is performed by the likes of CVD and RIE, for example.

Figure 9:
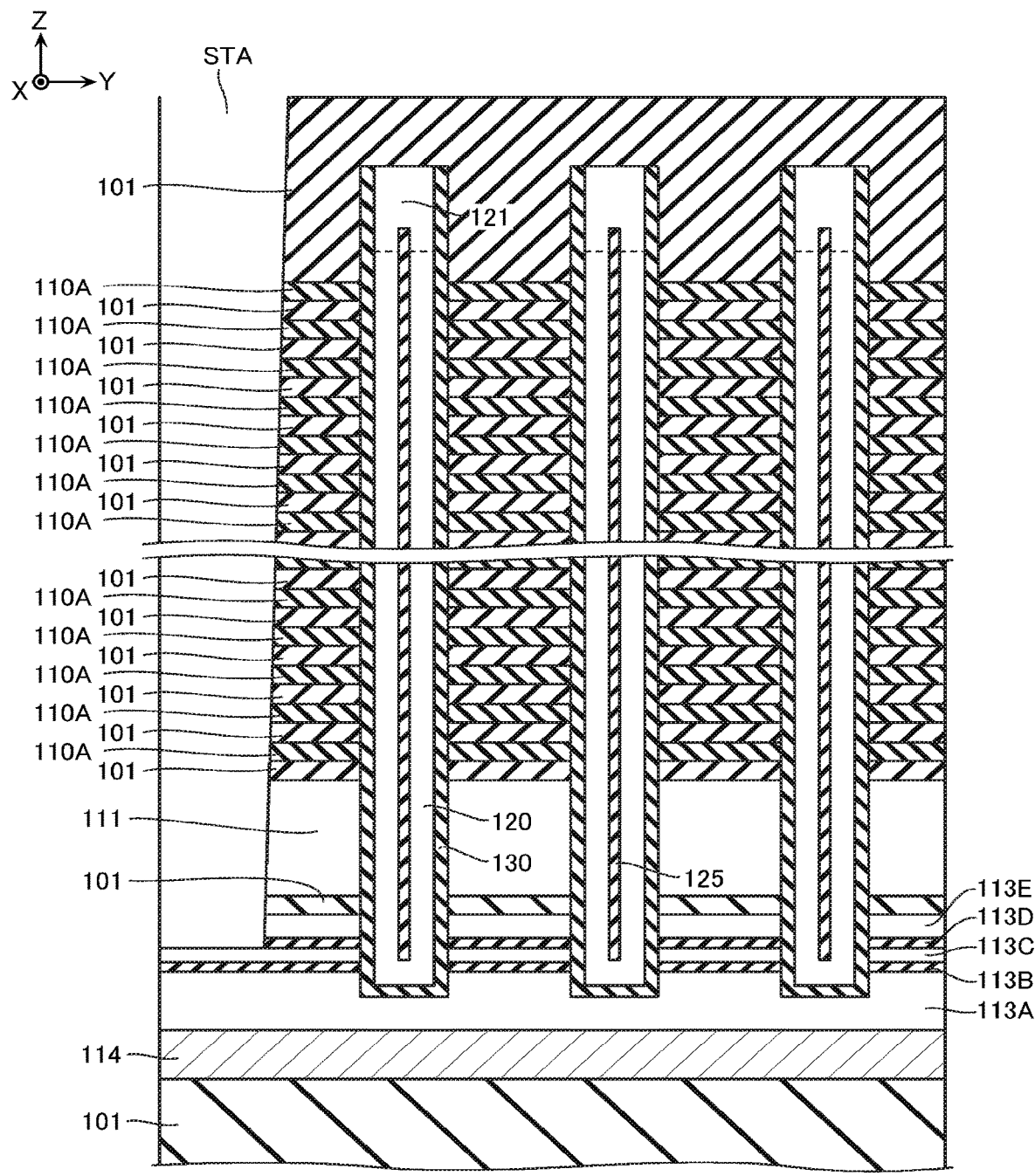
FIG. 9 is a schematic cross-sectional view for explaining same manufacturing method.

Next, as shown in FIG. 9, for example, a trench STA is formed. The trench STA extends in the Z direction and the X direction, divides the insulating layers 101 and sacrifice layers 110A, the conductive layer 111, the semiconductor layer 113E, and the sacrifice layer 113D in the Y direction, and exposes an upper surface of the sacrifice layer 113C. This step is performed by a method such as RIE, for example.

Figure 10:
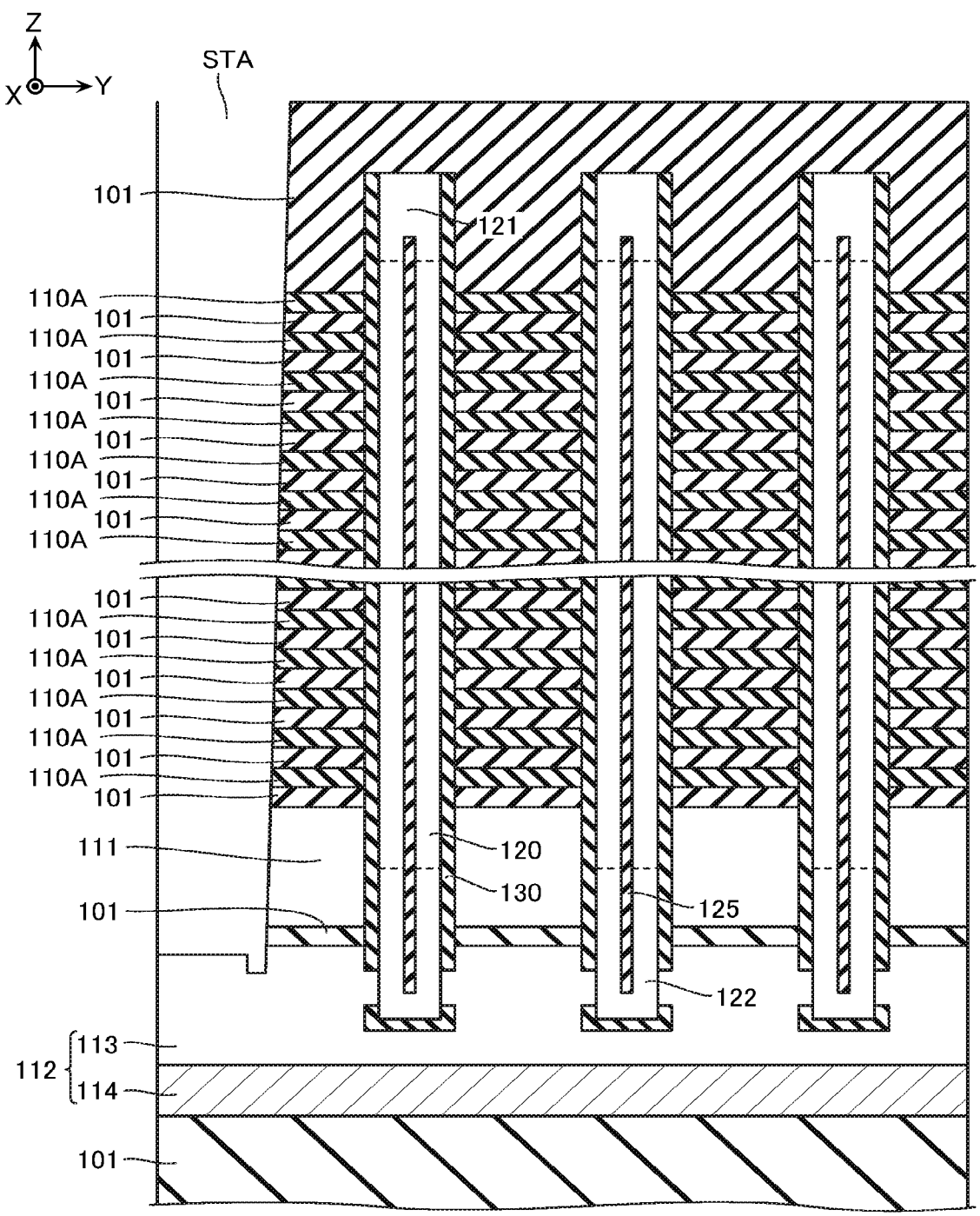
FIG. 10 is a schematic cross-sectional view for explaining same manufacturing method.

Next, as shown in FIG. 10, for example, the conductive layer 112 is formed. In this step, for example, an unillustrated side wall protective film is formed on a side surface in the Y direction of the trench STA. Moreover, the sacrifice layers 113B, 113C, 113D are removed by a method such as wet etching. Furthermore, part of the gate insulating film 130 is removed and part of the semiconductor column 120 is exposed, by a method such as wet etching. Moreover, the semiconductor layer 113 is formed by a method such as epitaxial growth. The impurity region 122 is formed through the semiconductor layer 113, in the lower end portion of the semiconductor column 120. In addition, the above-described unillustrated side wall protective film that has been formed on the side surface in the Y direction of the trench STA, is removed.

Figure 11:
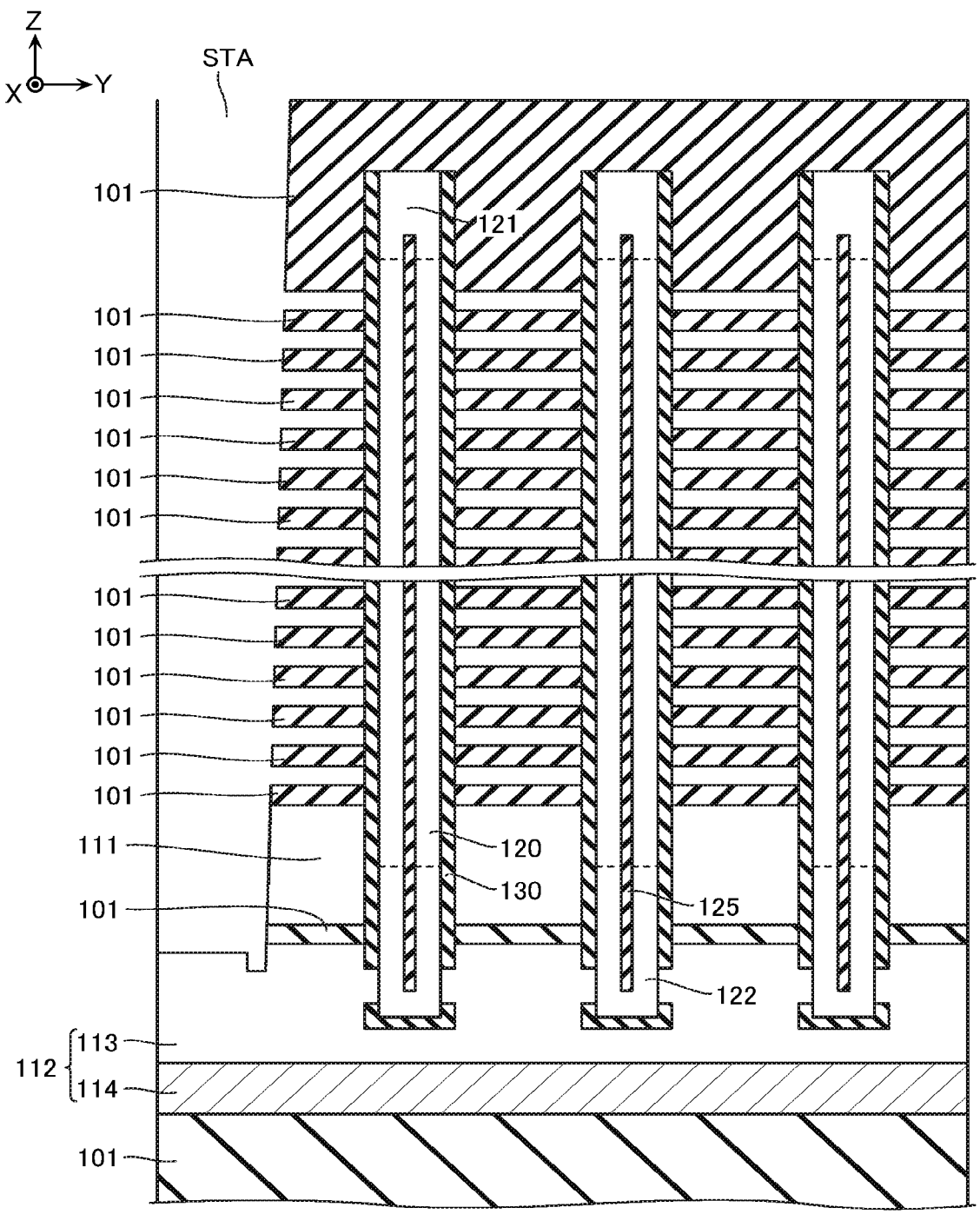
FIG. 11 is a schematic cross-sectional view for explaining same manufacturing method.
Figure 12:
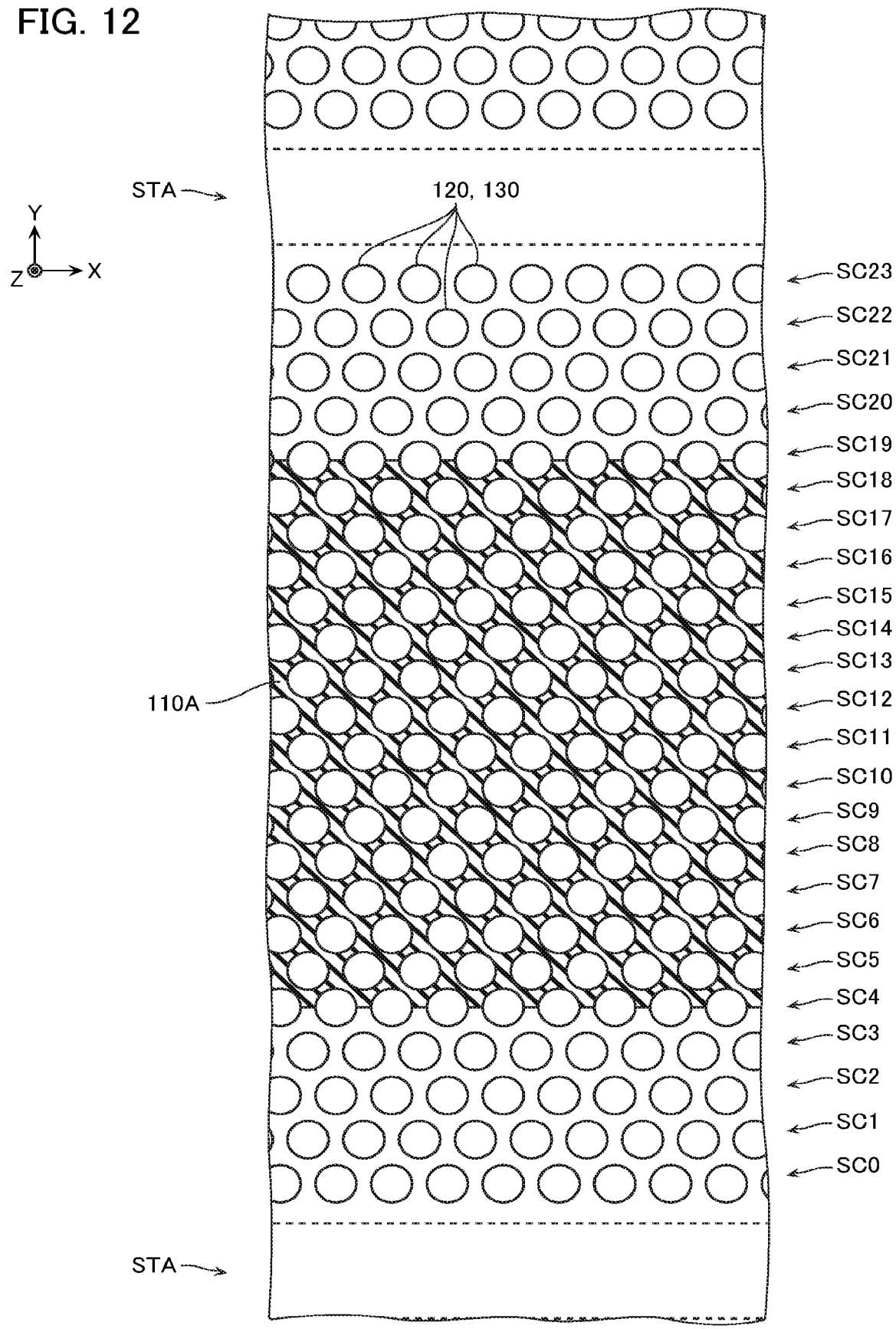
FIG. 12 is a schematic plan view for explaining same manufacturing method.

Next, as shown in FIG. 11, for example, the sacrifice layers 110A are removed via the trench STA. As a result, there is formed a hollow structure that includes the plurality of insulating layers 101 arranged in the Z direction and a structure within the memory hole MH (the semiconductor column 120, gate insulating film 130, and insulating layer 125) supporting these insulating layers 101. This step is performed by a method such as wet etching, for example. Note that in this step, as shown in FIG. 12, for example, the sacrifice layers 110A are removed from a region close to the trench STA.

Figure 13:
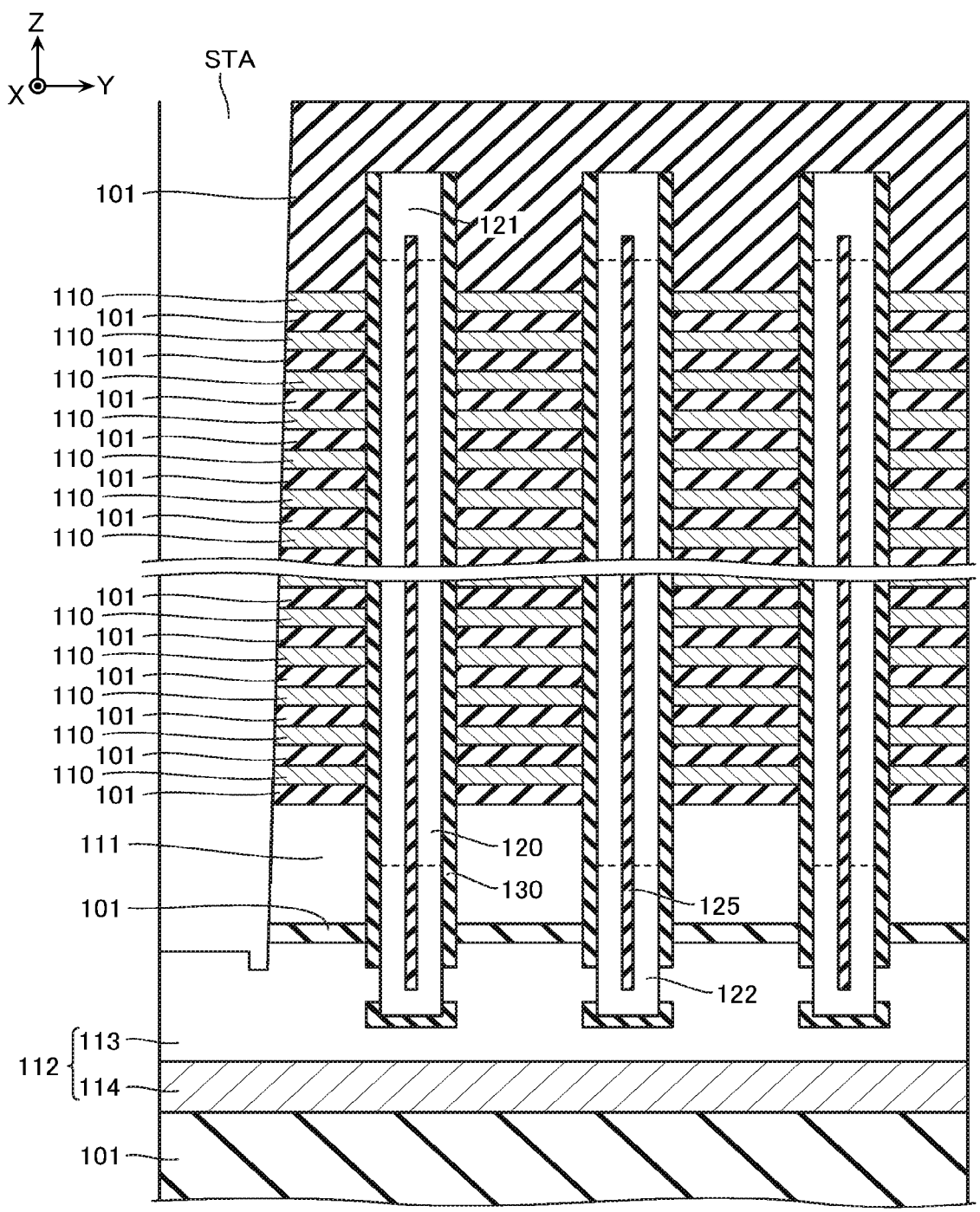
FIG. 13 is a schematic cross-sectional view for explaining same manufacturing method.
Figure 14:
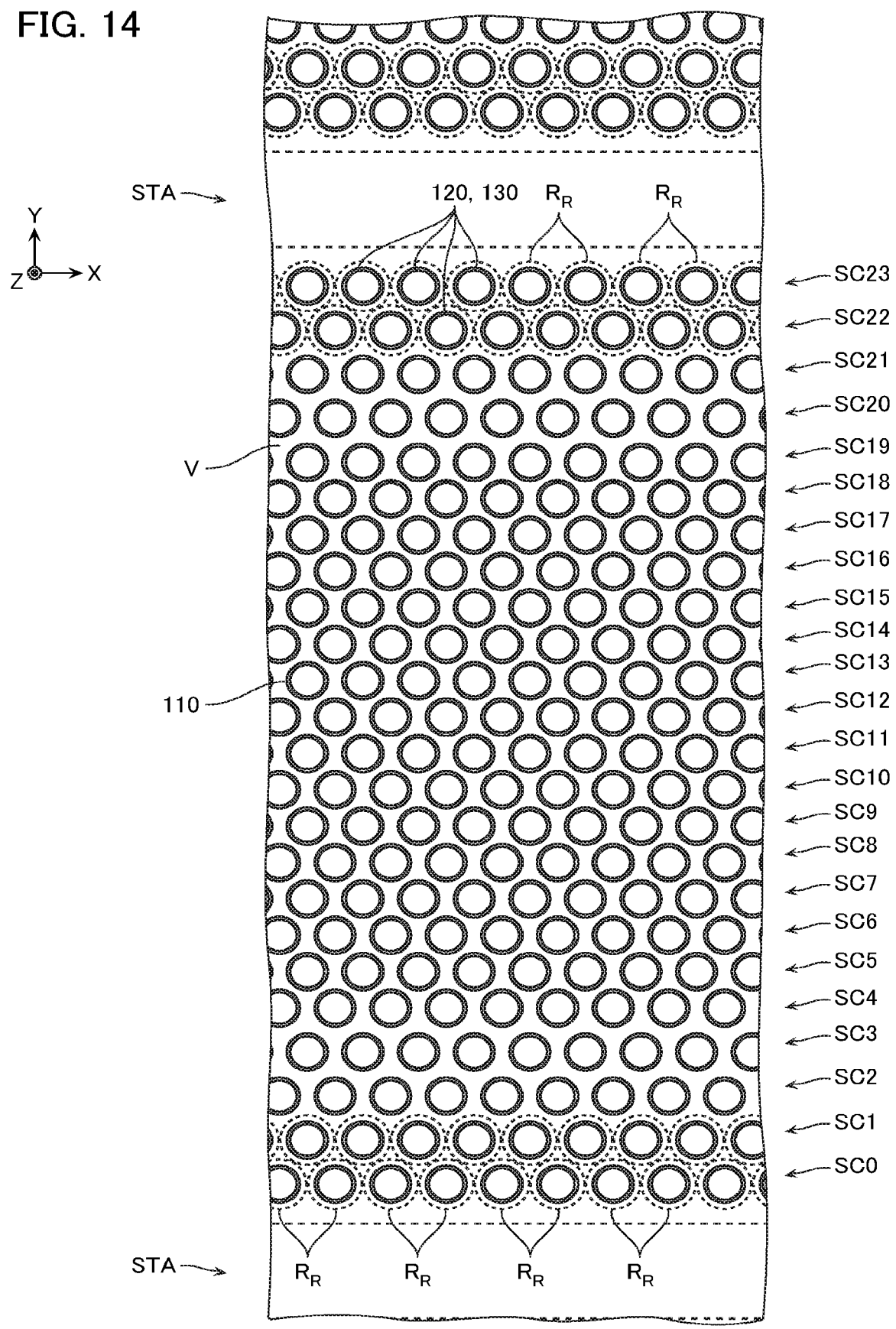
FIG. 14 is a schematic plan view for explaining same manufacturing method.

Next, as shown in FIG. 13, for example, the conductive layers 110 are formed. In this step, for example, the barrier conductive film of the likes of titanium nitride (TiN) configuring the conductive layer 110 is formed by a method such as CVD. In addition, the metal film of the likes of tungsten (W) configuring the conductive layer 110 is formed by a method such as CVD employing a halogenated metal such as tungsten hexafluoride ($WF_6$).

Now, in this step, as shown in FIG. 14, for example, film formation of the conductive layer 110 is started on the outer peripheral surfaces of each of the gate insulating films 130 from a start time of the step of CVD or the like. Now, in the outer peripheral surfaces of those of the gate insulating films 130 whose distance from the trench STA is comparatively large, film formation of the conductive layer 110 sometimes occurs at a comparatively slow speed. On the other hand, in the outer peripheral surfaces of those of the gate insulating films 130 whose distance from the trench STA is comparatively small, film formation of the conductive layer 110 sometimes occurs at a comparatively fast speed. Now, if a film thickness of the conductive layer 110 is comparatively large, roughness of a conductive layer 110 surface tends to get comparatively large. Particularly, in the outer peripheral surfaces of the gate insulating films 130 corresponding to the semiconductor column rows SC0, SC1 and the outer peripheral surfaces of the gate insulating films 130 corresponding to the semiconductor column rows SC22, SC23, roughness of the conductive layer 110 sometimes gets comparatively large. FIG. 14 shows schematically a range-of-roughness $R_R$ of the conductive layer 110 in the outer peripheral surfaces of these gate insulating films 130. As a result, there is a possibility that before a space corresponding to the conductive layer 110 is entirely filled in by a metal material such as tungsten (W), a path for supplying the tungsten hexafluoride ($WF_6$) between this space and the trench STA will be blocked and a void V is formed inside this space, due to unevenness formed on the outer peripheral surfaces of the gate insulating films 130.

Subsequently, as shown in FIG. 4, for example, the inter-block insulating layer ST is formed inside the trench STA, the wirings, and so on, are formed, and a wafer is divided by dicing, whereby the semiconductor memory device according to the first embodiment is formed.

Comparative Example

Figure 15:
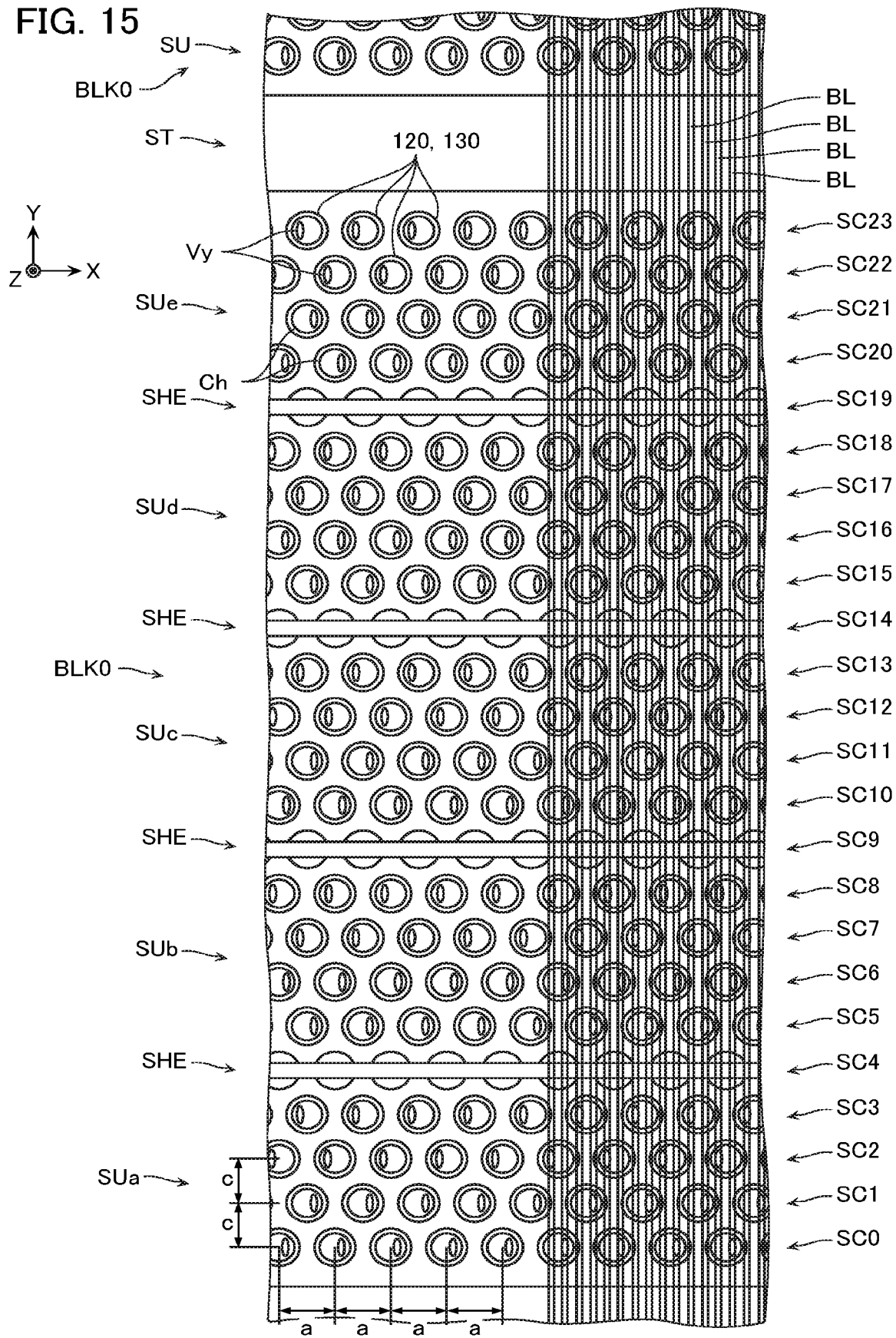
FIG. 15 is a schematic plan view showing some of configurations of a semiconductor memory device according to a comparative example.

Next, a semiconductor memory device according to a comparative example will be described with reference to FIG. 15. FIG. 15 is a schematic plan view showing some of configurations of the semiconductor memory device according to the comparative example. As shown in FIG. 15, the semiconductor memory device according to the comparative example comprises a memory block BLK0 instead of the memory block BLK. In the memory block BLK0, the semiconductor column rows SC0-SC23 are aligned in the Y direction with the pitch c.

Figure 16:
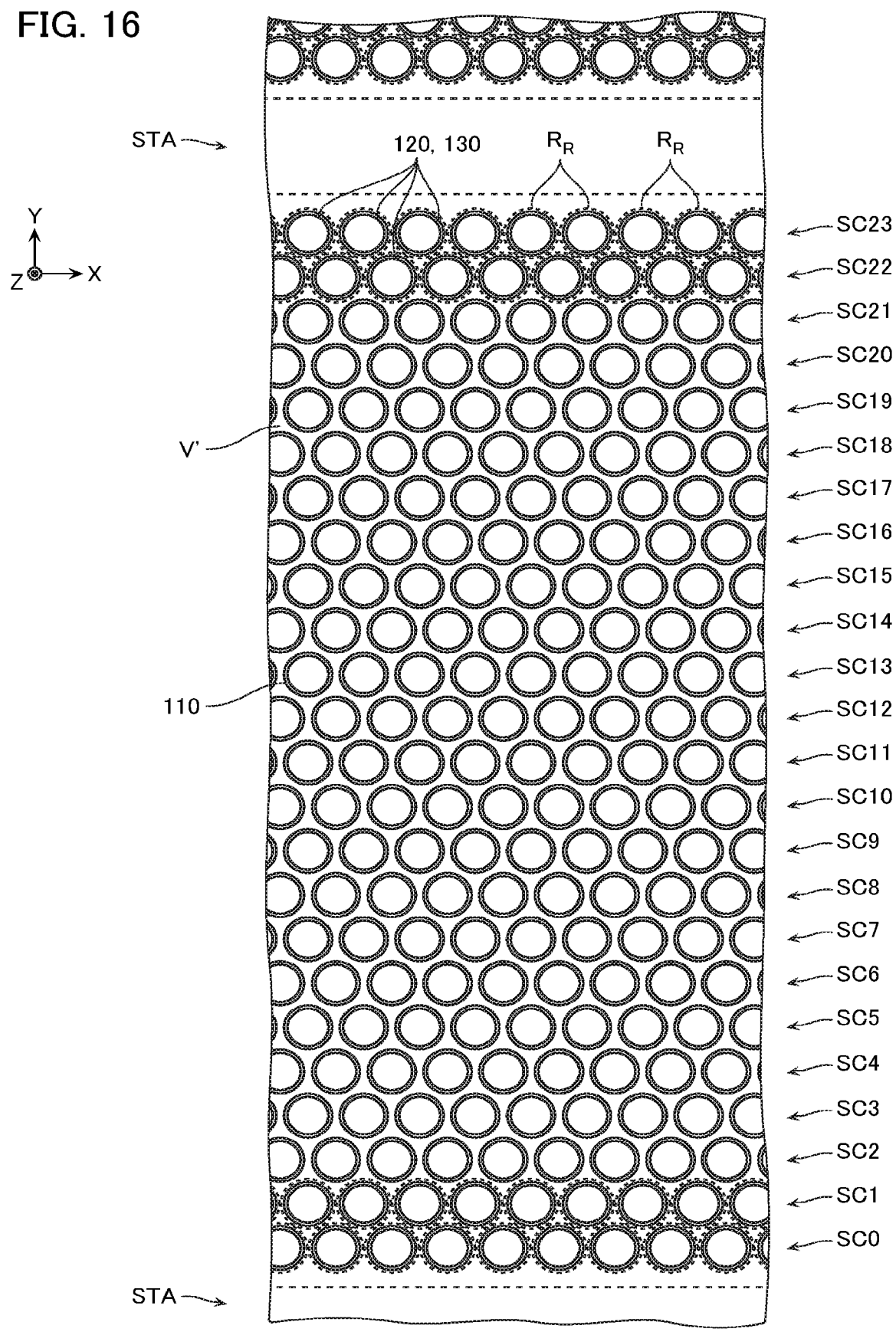
FIG. 16 is a schematic plan view for explaining a manufacturing method of same semiconductor memory device.

FIG. 16 is a schematic plan view for explaining a manufacturing method of the semiconductor memory device according to the comparative example. As shown in FIG. 16, when manufacturing the semiconductor memory device according to the comparative example, a void V' is sometimes formed inside the conductive layer 110.

Advantages of First Embodiment

As described with reference to FIG. 16, when manufacturing the semiconductor memory device according to the comparative example, the void V' is sometimes formed inside the conductive layer 110. Now, when the conductive layer 110 is formed by a method such as CVD employing a halogenated metal such as tungsten hexafluoride ($WF_6$), for example, there is a possibility of gas of a halogen such as fluorine (F) being left in the void V'. In such a case, it has sometimes occurred that during subsequent manufacturing steps, atoms of fluorine or the like diffuse to within the gate insulating film 130 and part of the block insulating film 133 (FIG. 5) is removed. As a result, there has been a risk of an insulation defect occurring between the conductive layer 110 and the semiconductor column 120.

Now, conceivably, the larger a volume of the void V' is, the more an amount of the fluorine (F) or the like left therein increases. Hence, conceivably, the larger the volume of the void V' is, the more easily such a phenomenon occurs.

As described with reference to FIG. 15, in the memory block BLK0 according to the comparative example, the semiconductor column rows SC0-SC23 are aligned in the Y direction with the pitch c of √3/2 times the pitch a. In such a configuration, sometimes, as shown in FIG. 16, for example, the above-described path will be blocked and the volume of the void V' get comparatively large in a state where the film thickness of the conductive layer 110 in the outer peripheral surfaces of each of the gate insulating films 130 is comparatively small.

On the other hand, as described with reference to FIG. 3, in the memory block BLK according to the first embodiment, the semiconductor column rows SC4-SC19 are aligned in the Y direction with the pitch b which is smaller than √3/2 times the pitch a. In such a configuration, as shown in FIG. 14, for example, it is possible for the volume of the void V to be made comparatively small, even if the above-described path is blocked in a state where the film thickness of the conductive layer 110 in the outer peripheral surfaces of each of the gate insulating films 130 is comparatively small. Hence, due to the semiconductor memory device according to the first embodiment, occurrence of the above-mentioned kind of insulation defect can be suppressed.

Moreover, it is conceivable too for all of the semiconductor column rows SC0-SC23 included in the memory block to be aligned in the Y direction with the pitch b smaller than √3/2 times the pitch a, for example. However, if such a configuration is adopted, there is a risk that in a comparatively early stage of the manufacturing step of the conductive layer 110, unevenness of the conductive layer 110 formed on the outer peripheral surfaces of the gate insulating films 130 corresponding to the semiconductor column row SC0 and unevenness of the conductive layer 110 formed on the outer peripheral surfaces of the gate insulating films 130 corresponding to the semiconductor column row SC1 make contact, for example. As a result, there is a risk of the above-described path of the likes of tungsten hexafluoride ($WF_6$) being blocked in a state where thickness of the conductive layers 110 in the outer peripheral surfaces of the gate insulating films 130 corresponding to the semiconductor column rows SC4-SC19 is even smaller.

Accordingly, in the memory block BLK according to the first embodiment, the semiconductor column rows SC0-SC4 are aligned in the Y direction with the pitch c of approximately √3/2 times the pitch a. In addition, the semiconductor column rows SC19-SC23 are aligned in the Y direction with the pitch c. As a result, blocking up of the above-described path of the likes of tungsten hexafluoride ($WF_6$) can be suppressed until thickness of the conductive layer 110 in the outer peripheral surfaces of the gate insulating films 130 corresponding to the semiconductor column rows SC4-SC19 attains a size of a certain level or more. As a result, the volume of the void V can be reduced, whereby occurrence of the above-mentioned kind of insulation defect can be suppressed.

Second Embodiment

Figure 17:
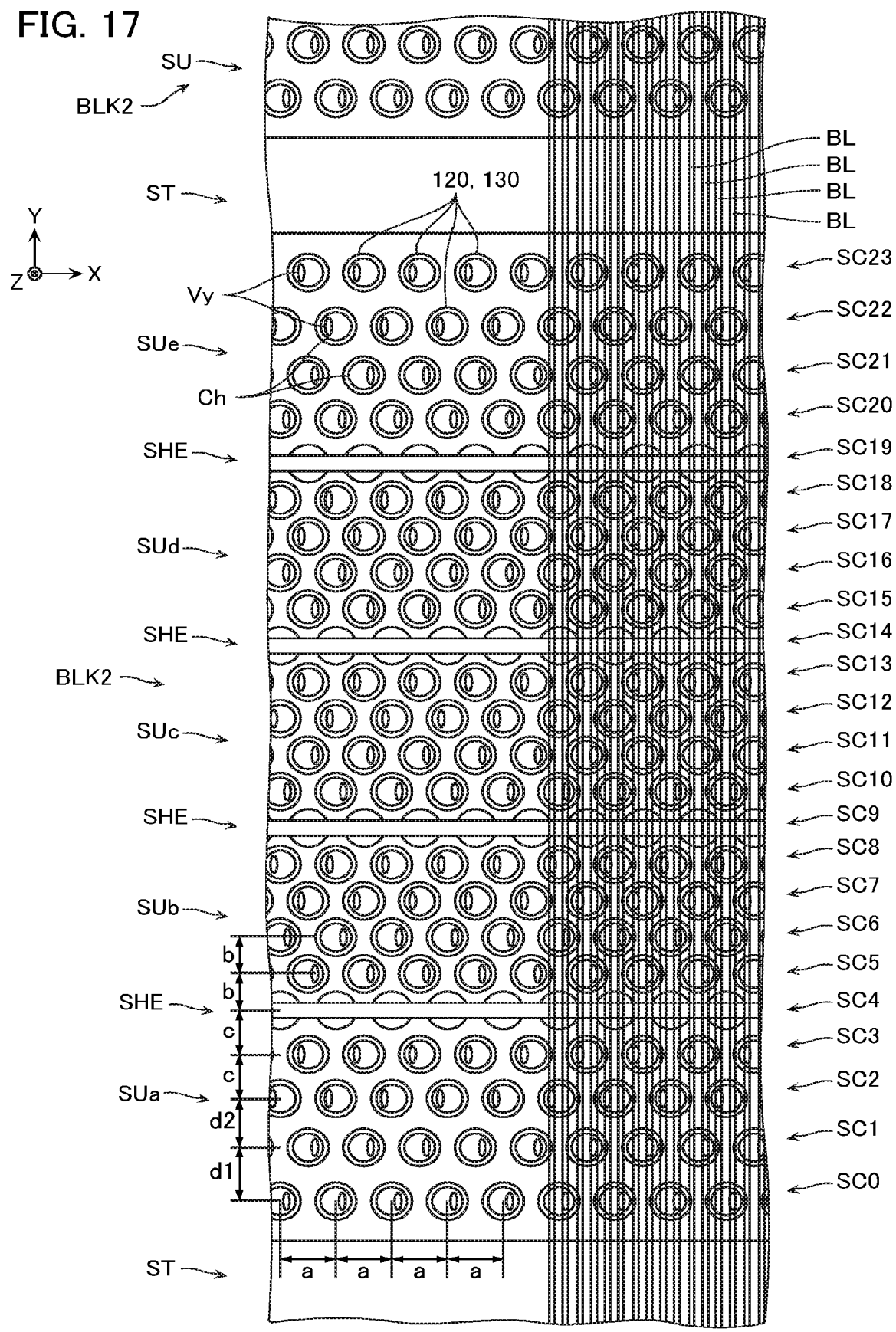
FIG. 17 is a schematic plan view for explaining a semiconductor memory device according to a second embodiment.

Next, a semiconductor memory device according to a second embodiment will be described with reference to FIG. 17. FIG. 17 is a schematic plan view for explaining the semiconductor memory device according to the second embodiment.

The semiconductor memory device according to the second embodiment is basically configured similarly to the semiconductor memory device according to the first embodiment. However, the semiconductor memory device according to the second embodiment comprises a memory block BLK2 instead of the memory block BLK. The memory block BLK2 is basically configured similarly to the memory block BLK.

However, positions in the Y direction of the semiconductor column rows SC0, SC1 differ between the memory block BLK and the memory block BLK2. Moreover, positions in the Y direction of the semiconductor column rows SC22, SC23 differ between the memory block BLK and the memory block BLK2. For example, in FIG. 17, a distance in the Y direction between the center position in the Y direction of the semiconductor column row SC0 and the center position in the Y direction of the semiconductor column row SC1 is shown as a distance d1. Moreover, in FIG. 17, a distance in the Y direction between the center position in the Y direction of the semiconductor column row SC1 and the center position in the Y direction of the semiconductor column row SC2 is shown as a distance d2. The distance d1 may be larger than the pitch c. The distance d2 may be the same as or larger than the pitch c, and, may be the same as or less than the distance d1, for example.

Now, the above-described path of the likes of tungsten hexafluoride ($WF_6$) includes: a path between two semiconductor columns 120 adjacent in the X direction; and a path between two semiconductor columns 120 adjacent in a direction at +/−approximately 60° to the X direction (a direction at +/−approximately 30° to the Y direction). Hereafter, the former will sometimes be called a "first path". Moreover, the latter will sometimes be called a "second path".

As described with reference to FIG. 3, for example, in the first embodiment, the distance in the Y direction between the center positions in the Y direction of the semiconductor column rows SC0, SC1 is equal to the pitch c (=approximately √3/2 times the pitch a). Moreover, the distance in the Y direction between the center positions in the Y direction of the semiconductor column rows SC1, SC2 is equal to the pitch c (=approximately √3/2 times the pitch a). In such a configuration, the distance between two semiconductor columns 120 adjacent in the direction at +/−approximately 60° to the X direction, in the semiconductor column rows SC0, SC1 will be a distance about the same as the distance between two semiconductor columns 120 adjacent in the X direction (the pitch a), in the semiconductor column rows SC0, SC1. Hence, a probability of the above-described second path being blocked at a certain timing will conceivably be about the same as a probability of the above-described first path being blocked at this timing.

On the other hand, in the second embodiment, the distance in the Y direction between the center positions in the Y direction of the semiconductor column rows SC0, SC1 is larger than the pitch c. Moreover, the distance in the Y direction between the center positions in the Y direction of the semiconductor column rows SC1, SC2 may be larger than the pitch c. In such a configuration, the distance between two semiconductor columns 120 adjacent in the direction at +/−approximately 60° to the X direction, in the semiconductor column rows SC0, SC1 will be larger than the distance between two semiconductor columns 120 adjacent in the X direction (the pitch a), in the semiconductor column rows SC0, SC1. Hence, the probability of the above-described second path being blocked at a certain timing can be made lower than the probability of the above-described first path being blocked at this timing.

Hence, in the semiconductor memory device according to the second embodiment, blocking up of the above-described path of the likes of tungsten hexafluoride ($WF_6$) can be suppressed until thickness of the conductive layer 110 in the outer peripheral surfaces of the gate insulating films 130 corresponding to the semiconductor column rows SC4-SC19 attains a size of a certain level or more. As a result, the volume of the void V can be reduced, whereby occurrence of the above-mentioned kind of insulation defect can be suppressed.

Third Embodiment

Figure 18:
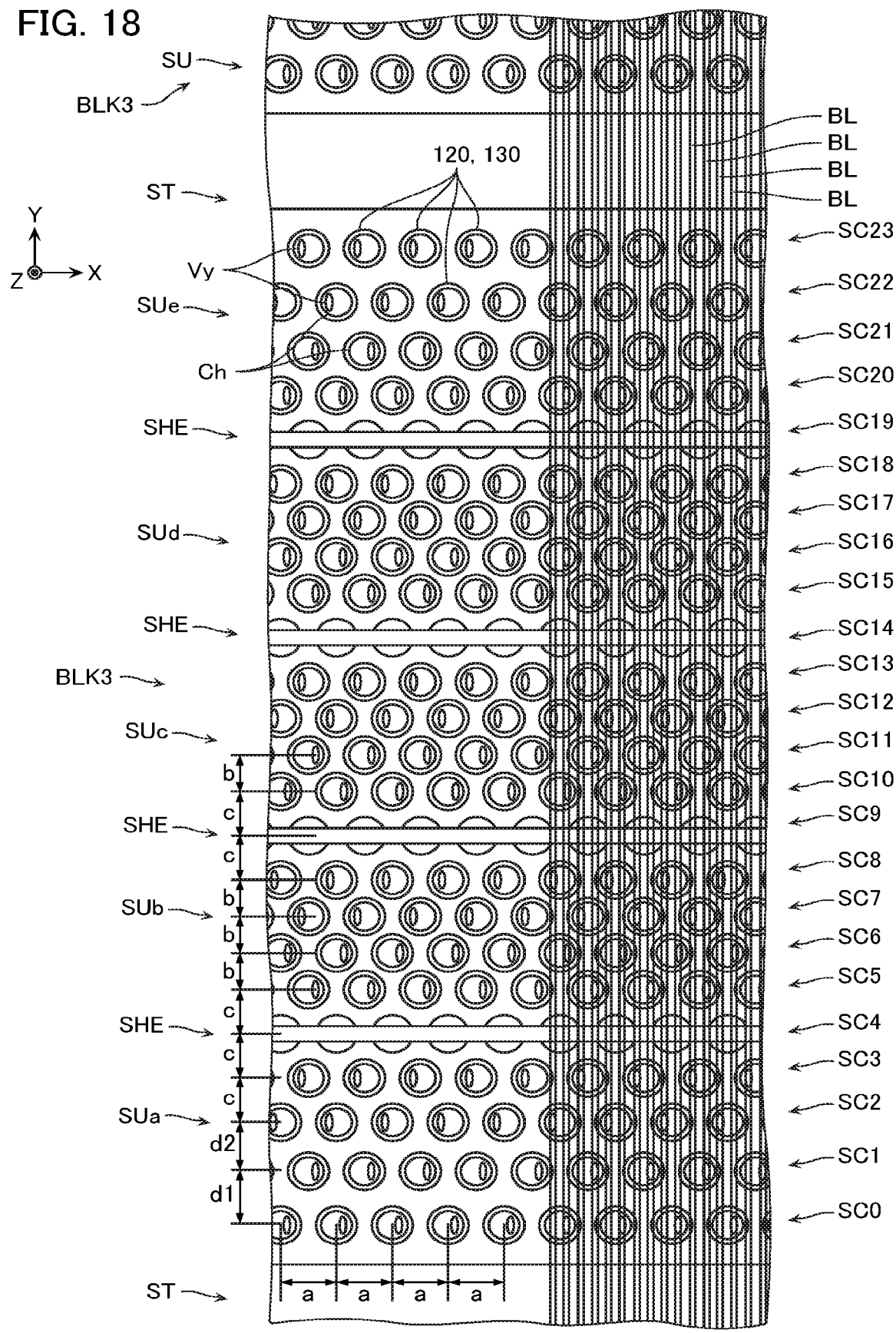
FIG. 18 is a schematic plan view for explaining a semiconductor memory device according to a third embodiment.

Next, a semiconductor memory device according to a third embodiment will be described with reference to FIG. 18. FIG. 18 is a schematic plan view for explaining the semiconductor memory device according to the third embodiment.

The semiconductor memory device according to the third embodiment is basically configured similarly to the semiconductor memory device according to the second embodiment. However, the semiconductor memory device according to the third embodiment comprises a memory block BLK3 instead of the memory block BLK2. The memory block BLK3 is basically configured similarly to the memory block BLK2.

However, in the memory block BLK3, distances in the Y direction between the center positions in the Y direction of the semiconductor column rows SC4, SC9, SC14, SC19 overlapping the inter-string unit insulating layers SHE and the center positions in the Y direction of the semiconductor column rows SC3, SC8, SC13, SC18 adjacent thereto from the one side in the Y direction are set to a distance larger than the pitch b. Similarly, distances in the Y direction between the center positions in the Y direction of the semiconductor column rows SC4, SC9, SC14, SC19 overlapping the inter-string unit insulating layers SHE and the center positions in the Y direction of the semiconductor column rows SC5, SC10, SC15, SC20 adjacent thereto from the other side in the Y direction are set to a distance larger than the pitch b. For example, in the example of FIG. 18, these distances are set to a distance equal to the pitch c.

Now, as mentioned above, the inter-string unit insulating layer SHE is provided between two string units SU adjacent in the Y direction. If positions in the Y direction of the inter-string unit insulating layers SHE get misaligned, then the inter-string unit insulating layers SHE and the semiconductor columns 120 included in semiconductor column rows other than the semiconductor column rows SC4, SC9, SC14, SC19 sometimes make contact. In such a case, there is a risk that characteristics of the drain side select transistors STD greatly change, and that it becomes difficult for a read operation, a write operation, and so on, to be suitably executed.

As described with reference to FIG. 17, for example, in the semiconductor memory device according to the second embodiment, distances in the Y direction between the center positions in the Y direction of the semiconductor column rows SC4, SC9, SC14, SC19 overlapping the inter-string unit insulating layers SHE and the center positions in the Y direction of the semiconductor column rows adjacent thereto from the one side and the other side in the Y direction are equal to the pitch b. In such a configuration, sometimes, a margin of the position in the Y direction of the inter-string unit insulating layer SHE decreases, and yield falls.

Accordingly, as described with reference to FIG. 18, for example, in the semiconductor memory device according to the third embodiment, the distances in the Y direction between the center positions in the Y direction of the semiconductor column rows SC4, SC9, SC14, SC19 overlapping the inter-string unit insulating layers SHE and the center positions in the Y direction of the semiconductor column rows adjacent thereto from the one side and the other side in the Y direction are each set to the distance larger than the pitch b. As a result, the margin of the position in the Y direction of the inter-string unit insulating layer SHE can be increased, and yield thereby improved.

Note that the configuration of the kind shown in FIG. 18 is merely an exemplification, and that a specific configuration may be appropriately adjusted. For example, it is also possible in the semiconductor memory device according to the first embodiment for the distances in the Y direction between the center positions in the Y direction of the semiconductor column rows SC4, SC9, SC14, SC19 overlapping the inter-string unit insulating layers SHE and the center positions in the Y direction of the semiconductor column rows adjacent thereto from the one side and the other side in the Y direction to each be set to a distance larger than the pitch b (for example, a distance equal to the pitch c).

Fourth Embodiment

Figure 19:
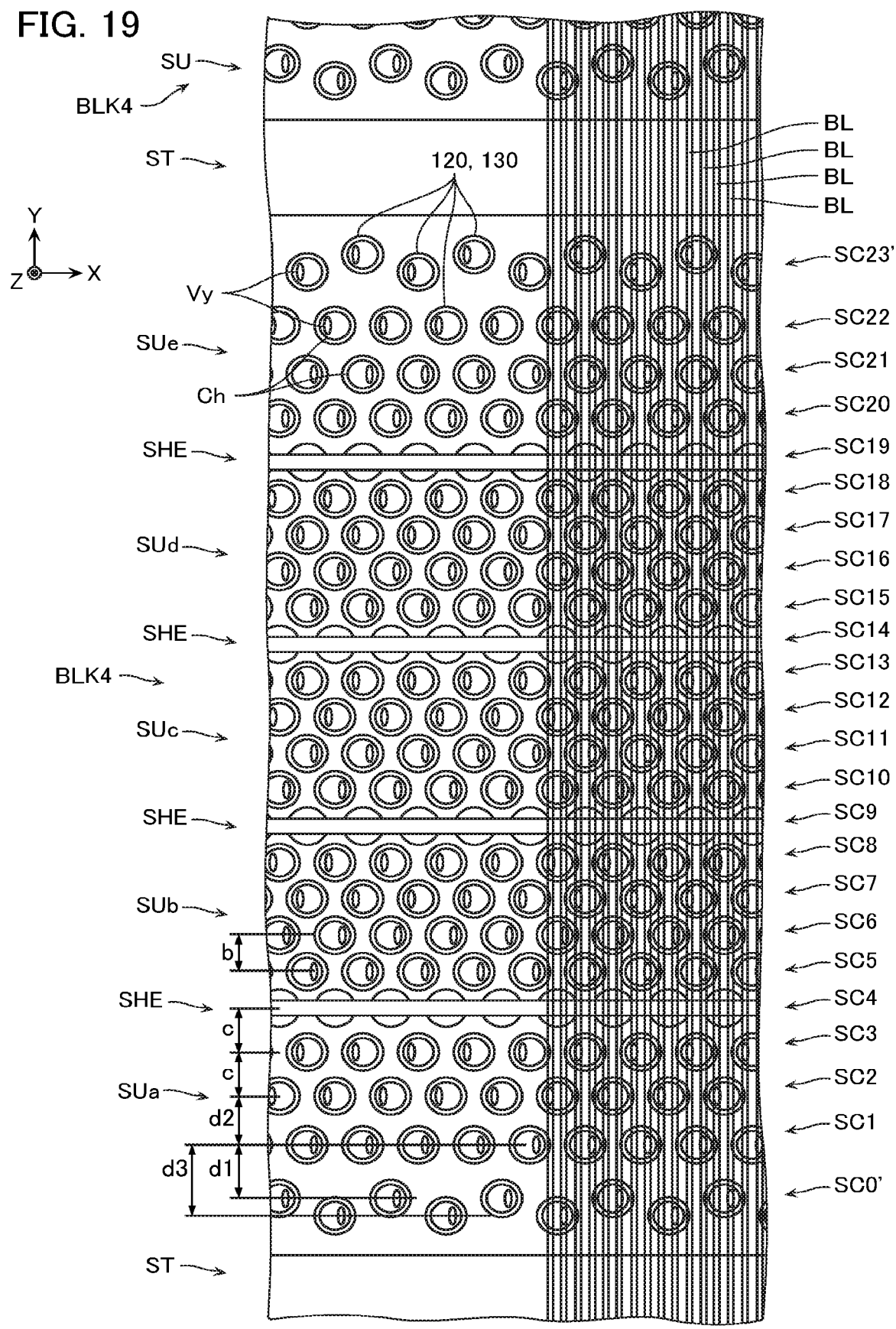
FIG. 19 is a schematic plan view for explaining a semiconductor memory device according to a fourth embodiment.

Next, a semiconductor memory device according to a fourth embodiment will be described with reference to FIG. 19. FIG. 19 is a schematic plan view for explaining the semiconductor memory device according to the fourth embodiment.

The semiconductor memory device according to the fourth embodiment is basically configured similarly to the semiconductor memory device according to the second embodiment. However, the semiconductor memory device according to the fourth embodiment comprises a memory block BLK4 instead of the memory block BLK2. The memory block BLK4 is basically configured similarly to the memory block BLK2.

However, the memory block BLK4 comprises semiconductor column rows SC0', SC23' instead of the semiconductor column rows SC0, SC23.

The semiconductor column row SC0' is basically configured similarly to the semiconductor column row SC0. However, positions in the Y direction of the semiconductor columns 120 differ between the semiconductor column row SC0' and the semiconductor column row SC0. For example, in FIG. 19, a distance in the Y direction between center positions of semiconductor columns 120 provided in odd-numbered positions counting from one side in the X direction (for example, a negative side in the X direction), of the plurality of semiconductor columns 120 included in the semiconductor column row SC0' and the center position in the Y direction of the semiconductor column row SC1 is indicated as the distance d1. Moreover, a distance in the Y direction between center positions of semiconductor columns 120 provided in even-numbered positions counting from the one side in the X direction, of the plurality of semiconductor columns 120 included in the semiconductor column row SC0' and the center position in the Y direction of the semiconductor column row SC1 is indicated as a distance d3. The distance d3 is larger than the distance d1. A difference of the distance d3 and the distance d1 may be ⅛ or more times the pitch c ($\sqrt{3}/16$ or more times the pitch a), and may be less than ¼ times the pitch c (less than $\sqrt{3}/8$ times the pitch a).

The semiconductor column row SC23' is configured similarly to the semiconductor column row SC0'.

Now, the distance between the center positions of the plurality of semiconductor columns 120 included in the semiconductor column row SC0 is the above-mentioned pitch a. On the other hand, the distance between the center positions of the plurality of semiconductor columns 120 included in the semiconductor column row SC0' is larger than the above-mentioned pitch a. Hence, a probability of the above-described first path corresponding to the semiconductor column row SC0' being blocked at a certain timing is lower than a probability of the above-described first path corresponding to the semiconductor column row SC0 being blocked at this timing. Similarly, a probability of the above-described first path corresponding to the semiconductor column row SC23' being blocked at a certain timing is lower than a probability of the above-described first path corresponding to the semiconductor column row SC23 being blocked at this timing.

Hence, in the semiconductor memory device according to the fourth embodiment, blocking up of the path of the likes of tungsten hexafluoride ($WF_6$) between the trench STA and a space corresponding to the conductive layer 110 can be suppressed until thickness of the conductive layer 110 in the outer peripheral surfaces of the gate insulating films 130 corresponding to the semiconductor column rows SC4-SC19 attains a size of a certain level or more. As a result, the volume of the void V can be reduced, whereby occurrence of the above-mentioned kind of insulation defect can be suppressed.

Moreover, if the difference of the distance d3 and the distance d1 is increased, a distance from a side surface on an inter-block insulating layer ST side of the conductive layer 110 to some of the semiconductor columns 120 included in the semiconductor column row SC0' (the semiconductor columns 120 provided in odd-numbered positions counting from the one side in the X direction) will sometimes get comparatively large. In such a case, there is a risk that when the sacrifice layers 110A are removed in the steps described with reference to FIGS. 11 and 12, the insulating layers 101 will sag at end portions on the inter-block insulating layer ST side in a cantilevered state. In order to suppress this, the difference of the distance d3 and the distance d1 may be set to less than ¼ times the pitch c (less than $\sqrt{3}/8$ times the pitch a), as mentioned above. As a result, sagging of the insulating layers 101 can be suppressed.

Note that FIG. 19 has described an example where the memory block BLK2 according to the second embodiment (FIG. 17) is provided with the semiconductor column rows SC0', SC23' instead of the semiconductor column rows SC0, SC23. However, such a configuration is merely an exemplification, and a specific configuration may be appropriately adjusted. For example, it is possible too for the memory block BLK according to the first embodiment, the memory block BLK3 according to the third embodiment, or a modified example of these to be provided with the semiconductor column rows SC0', SC23' instead of the semiconductor column rows SC0, SC23.

Fifth Embodiment

Figure 20:
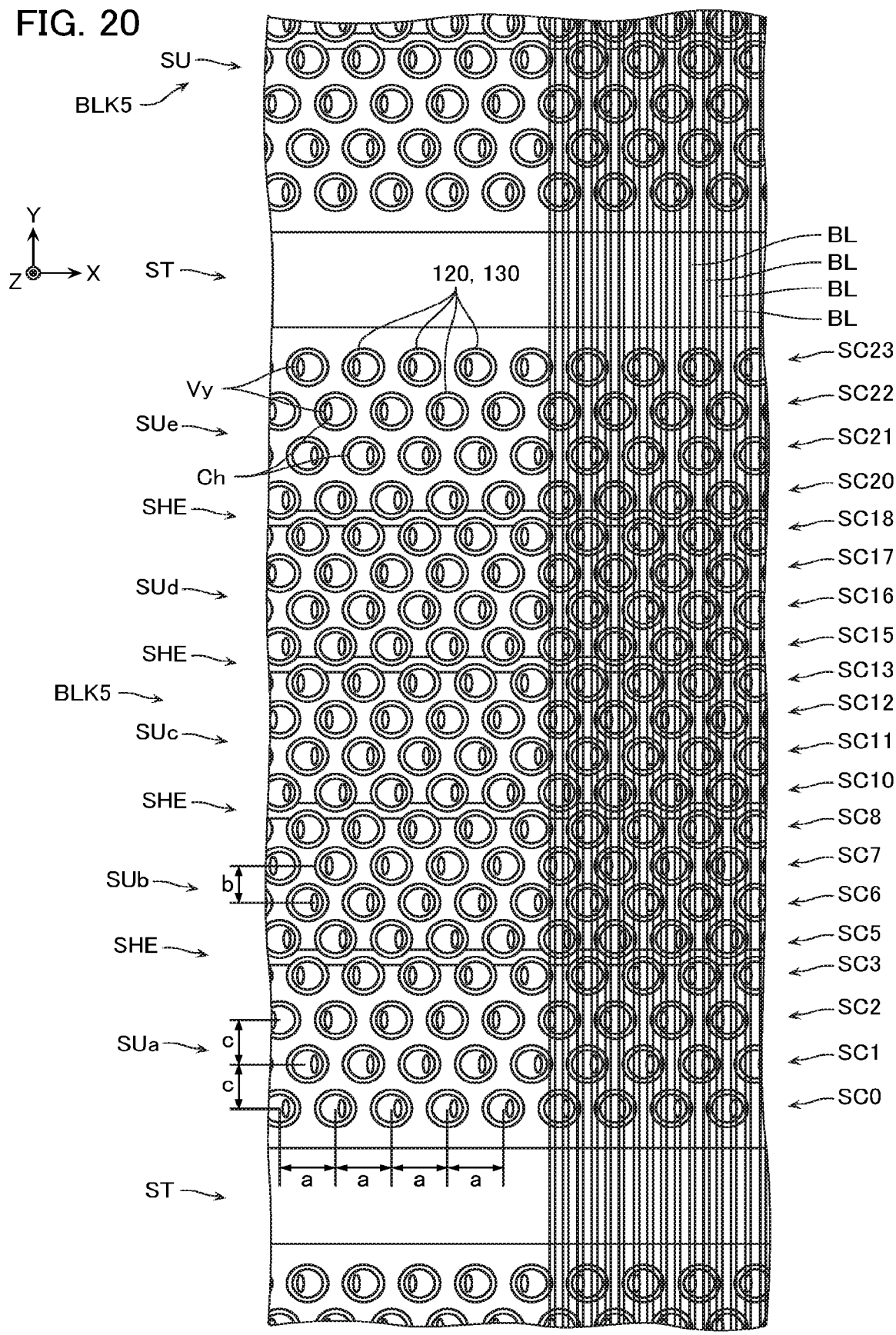
FIG. 20 is a schematic plan view for explaining a semiconductor memory device according to a fifth embodiment.

Next, a semiconductor memory device according to a fifth embodiment will be described with reference to FIG. 20. FIG. 20 is a schematic plan view for explaining the semiconductor memory device according to the fifth embodiment.

The semiconductor memory device according to the fifth embodiment is basically configured similarly to the semiconductor memory device according to the first embodiment. However, the semiconductor memory device according to the fifth embodiment comprises a memory block BLK5 instead of the memory block BLK. The memory block BLK5 is basically configured similarly to the memory block BLK.

However, in the memory block BLK5, the semiconductor column rows SC4, SC9, SC14, SC19 that overlap the inter-string unit insulating layers SHE and do not function as the channel regions in effective memory strings MS, are omitted. Moreover, in the memory block BLK5, the 14 semiconductor column rows SC3, SC5-SC8, SC10-SC13, SC15-SC18, SC20 are aligned with the pitch b consecutively in the Y direction. Note that, at positions corresponding to the conductive layers 110 functioning as the drain side select gate lines SGD, the outer peripheral surfaces of the gate insulating films 130 corresponding to the semiconductor column rows SC3, SC5, SC8, SC10, SC13, SC15, SC18, SC20 may partially contact the inter-string unit insulating layers SHE, or may be covered by the conductive layers 110 over their entire periphery.

In the structure of the kind shown in FIG. 20, the semiconductor column rows SC0, SC1, SC22, SC23 may be disposed similarly to in the first embodiment (FIG. 3), or may be disposed similarly to in the second embodiment (FIG. 17). Moreover, in either case, the semiconductor column rows SC0', SC23' (FIG. 19) may be provided instead of the semiconductor column rows SC0, SC23.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first conductive layer extending in a first direction;
a second conductive layer extending in the first direction, the second conductive layer being aligned with the first conductive layer in a second direction intersecting the first direction;
a plurality of first semiconductor column rows aligned in the second direction; and
a plurality of second semiconductor column rows aligned in the second direction,
the plurality of first semiconductor column rows each comprising a plurality of first semiconductor columns aligned in the first direction,
the plurality of first semiconductor columns each facing the first conductive layer,
the plurality of second semiconductor column rows each comprising a plurality of second semiconductor columns aligned in the first direction,
the plurality of second semiconductor columns each facing the second conductive layer, and
when a cross section extending in the first direction and the second direction and including the first conductive layer and the second conductive layer is assumed to be a first cross section, and a distance in the first direction between center positions in the first cross section of two of the first semiconductor columns adjacent in the first direction is assumed to be a first adjacent distance,
a pitch in the second direction of the plurality of first semiconductor column rows is equal to $(\sqrt{3})/2$ times the first adjacent distance or is more than $(\sqrt{3})/2$ times the first adjacent distance, and
a pitch in the second direction of the plurality of second semiconductor column rows is less than $(\sqrt{3})/2$ times the first adjacent distance.

2. The semiconductor memory device according to claim 1, further comprising a third conductive layer aligned with the first conductive layer and the second conductive layer, in a third direction intersecting the first direction and the second direction,
wherein the plurality of first semiconductor columns each face the third conductive layer, and
the plurality of second semiconductor columns each face the third conductive layer.

3. The semiconductor memory device according to claim 2, wherein a plurality of first semiconductor columns are a semiconductor column group disposed close to one end in the second direction of the third conductive layer, among a plurality of other first and second semiconductor columns, all first and second semiconductor columns facing the third conductive layer.

4. The semiconductor memory device according to claim 1, further comprising a third semiconductor column row provided between the first conductive layer and the second conductive layer,
wherein the third semiconductor column row comprises a plurality of third semiconductor columns aligned in the first direction, and
the plurality of third semiconductor columns each comprise a region facing the first conductive layer, and a region facing the second conductive layer.

5. The semiconductor memory device according to claim 4, wherein a distance in the second direction between (1) a center position in the second direction of the second semiconductor column row closest to the third semiconductor column row, of the plurality of second semiconductor column rows, and (2) a center position in the second direction of the third semiconductor column row, is less than $(\sqrt{3})/2$ times the first adjacent distance.

6. The semiconductor memory device according to claim 4, wherein a distance in the second direction between (1) a center position in the second direction of the second semiconductor column row closest to the third semiconductor column row, of the plurality of second semiconductor column rows, and (2) a center position in the second direction of the third semiconductor column row, is equal to $(\sqrt{3})/2$ times the first adjacent distance or is more than $(\sqrt{3})/2$ times the first adjacent distance.

7. The semiconductor memory device according to claim 4, wherein a distance in the second direction between (1) a center position in the second direction of the first semiconductor column row closest to the third semiconductor column row, of the plurality of first semiconductor column rows, and (2) a center position in the second direction of the third semiconductor column row, is equal to $\sqrt{3}/2$ times the first adjacent distance or is more than $\sqrt{3}/2$ times the first adjacent distance.

8. The semiconductor memory device according to claim 1, further comprising a plurality of third semiconductor columns whose positions in the first direction are mutually different and that face the first conductive layer,
wherein the plurality of first semiconductor column rows are provided between the plurality of third semiconductor columns and the plurality of second semiconductor column rows, and
when a position in the second direction of third semiconductor columns provided in odd-numbered positions counting from one side in the first direction, of the plurality of third semiconductor columns is assumed to be a first position, and a position in the second direction of third semiconductor columns provided in even-numbered positions counting from the one side in the first direction, of the plurality of third semiconductor columns is assumed to be a second position,
the second position differs from the first position.

9. The semiconductor memory device according to claim 8, wherein when a center position in the second direction of the first semiconductor column row closest to the plurality of third semiconductor columns, of the plurality of first semiconductor column rows is assumed to be a third position,
a difference between the first position and the third position is equal to $(\sqrt{3})/2$ times the first adjacent distance or is more than $(\sqrt{3})/2$ times the first adjacent distance, and
a difference between the second position and the third position is equal to $(\sqrt{3})/2$ times the first adjacent distance or is more than $(\sqrt{3})/2$ times the first adjacent distance.

10. The semiconductor memory device according to claim 8, wherein a difference between the first position and the second position is equal to $(\sqrt{3})/16$ times the first adjacent distance or is more than $(\sqrt{3})/16$ the first adjacent distance; and
the difference between the first position and the second position is less than $(\sqrt{3})/8$ times the first adjacent distance.

11. The semiconductor memory device according to claim 8, further comprising a third conductive layer aligned with the first conductive layer and the second conductive layer, in a third direction intersecting the first direction and the second direction,
wherein the plurality of first semiconductor columns each face the third conductive layer,
the plurality of second semiconductor columns each face the third conductive layer, and
the plurality of third semiconductor columns each face the third conductive layer.

12. The semiconductor memory device according to claim 11, wherein the plurality of third semiconductor columns are a semiconductor column group disposed close to one end in the second direction of the third conductive layer, among a plurality of first, second, and third semiconductor columns, the first, second, and third semiconductor columns all facing the third conductive layer.

13. A semiconductor memory device, comprising:
a first conductive layer extending, in plan view, in a first direction and a second direction that intersects the first direction, the first conductive layer comprising one end portion and an other end portion in the second direction;
a plurality of first semiconductor columns provided between the one end portion and the other end portion in the second direction of the first conductive layer, the plurality of first semiconductor columns having mutually different positions in the first direction and each facing the first conductive layer;
a plurality of second semiconductor columns provided between the plurality of first semiconductor columns and the other end portion in the second direction of the first conductive layer, the plurality of second semiconductor columns being aligned in the first direction and each facing the first conductive layer; and
a plurality of third semiconductor columns provided between the plurality of second semiconductor columns and the other end portion in the second direction of the first conductive layer, the plurality of third semiconductor columns being aligned in the first direction and each facing the first conductive layer,
when a cross section extending in the first direction and the second direction and including the first conductive layer is assumed to be a first cross section, and a distance in the first direction between center positions in the first cross section of two of the third semiconductor columns adjacent in the first direction is assumed to be a first adjacent distance,
a distance in the first direction between center positions in the first cross section of two of the first semiconductor columns adjacent in the first direction is the first adjacent distance, and
a distance in the first direction between center positions in the first cross section of two of the second semiconductor columns adjacent in the first direction is the first adjacent distance,
when a position in the second direction of first semiconductor columns provided in odd-numbered positions counting from one side in the first direction, of the plurality of first semiconductor columns is assumed to be a first position, a position in the second direction of first semiconductor columns provided in even-numbered positions counting from the one side in the first direction, of the plurality of first semiconductor columns is assumed to be a second position, a position in the second direction of the plurality of second semiconductor columns is assumed to be a third position, a position in the second direction of the plurality of third semiconductor columns is assumed to be a fourth position, a distance between the first position and the third position is assumed to be a first distance, a distance between the second position and the third position is assumed to be a second distance, and a distance between the third position and the fourth position is assumed to be a third distance,
the first distance is larger than the third distance,
the second distance is larger than the third distance, and
the second distance is different from the first distance,
wherein a center position in the first cross section of one of the first semiconductor columns provided in the odd-numbered positions counting from the one side in the first direction, of the plurality of first semiconductor columns is assumed to be a first center position,
a center position in the first cross section of one of the first semiconductor columns provided in the even-numbered positions counting from the one side in the first direction, of the plurality of first semiconductor columns is assumed to be a second center position,
a center position in the first cross section of one of the plurality of second semiconductor columns is assumed to be a third center position,
a distance in the second direction between the first center position and the third center position is assumed to be the first distance,
a distance in the second direction between the second center position and the third center position is assumed to be the second distance,
the first distance is equal to $(\sqrt{3})/2$ times the first adjacent distance or is more than $(\sqrt{3})/2$ times the first adjacent distance, and
the second distance is equal to $(\sqrt{3})/2$ times the first adjacent distance or is more than $\sqrt{(3)}/2$ the first adjacent distance.

14. The semiconductor memory device according to claim 13, wherein
a difference between the first distance and the second distance is equal to $(\sqrt{3})/16$ times the first adjacent distance or is more than $(\sqrt{3})/16$ times the first adjacent distance; and
the difference between the first distance and the second distance is less than $(\sqrt{3})/8$ times the first adjacent distance.

15. The semiconductor memory device according to claim 13, further comprising:
a second conductive layer extending in the first direction, the second conductive layer being aligned with the first conductive layer in the second direction and comprising one end portion and an other end portion in the second direction;
a plurality of fourth semiconductor columns provided between the one end portion and the other end portion in the second direction of the second conductive layer, the plurality of fourth semiconductor columns being aligned in the first direction and each facing the second conductive layer; and
a plurality of fifth semiconductor columns provided between the plurality of fourth semiconductor columns and the other end portion in the second direction of the second conductive layer, the plurality of fifth semiconductor columns being aligned in the first direction and each facing the second conductive layer,
wherein when a position in the second direction of the plurality of fourth semiconductor columns is assumed to be a fifth position, a position in the second direction of the plurality of fifth semiconductor columns is assumed to be a sixth position, and a distance between the fifth position and the sixth position is assumed to be a fourth distance,
the first distance is larger than the fourth distance, and
the second distance is larger than the fourth distance.

16. The semiconductor memory device according to claim 15, further comprising a third conductive layer aligned with the first conductive layer and the second conductive layer, in a third direction intersecting the first direction and the second direction,
wherein the plurality of first semiconductor columns each face the third conductive layer,
the plurality of second semiconductor columns each face the third conductive layer,
the plurality of third semiconductor columns each face the third conductive layer,
the plurality of fourth semiconductor columns each face the third conductive layer,
the plurality of fifth semiconductor columns each face the third conductive layer, and
a plurality of first semiconductor columns are a semiconductor column group disposed close to one end in the second direction of the third conductive layer, among a plurality of other first, second, third, fourth, and fifth semiconductor columns, the first, second, third, fourth, and fifth semiconductor columns all facing the third conductive layer.

17. A semiconductor memory device, comprising:
a first conductive layer extending, in plan view, in a first direction and a second direction that intersects the first direction, the first conductive layer comprising one end portion and an other end portion in the second direction;
a second conductive layer extending in the first direction, the second conductive layer being aligned with the first conductive layer in the second direction and comprising one end portion and the other end portion in the second direction;
a plurality of first semiconductor columns provided between the one end portion and the other end portion in the second direction of the first conductive layer, the plurality of first semiconductor columns having mutually different positions in the first direction and each facing the first conductive layer;
a plurality of second semiconductor columns provided between the plurality of first semiconductor columns and the other end portion in the second direction of the first conductive layer, the plurality of second semiconductor columns being aligned in the first direction and each facing the first conductive layer; and a plurality of semiconductor column rows aligned with a first pitch in the second direction, the plurality of semiconductor column rows each including a plurality of third semiconductor columns aligned in the first direction and each facing the second conductive layer, when a cross section extending in the first direction and the second direction and including the first conductive layer and the second conductive layer is assumed to be a first cross section, and a distance in the first direction between center positions in the first cross section of two of the third semiconductor columns adjacent in the first direction is assumed to be a first adjacent distance, a distance in the first direction between center positions in the first cross section of two of the first semiconductor columns adjacent in the first direction is the first adjacent distance, and a distance in the first direction between center positions in the first cross section of two of the second semiconductor columns adjacent in the first direction is the first adjacent distance, and when a position in the second direction of first semiconductor columns provided in odd-numbered positions counting from one side in the first direction, of the plurality of first semiconductor columns is assumed to be a first position, a position in the second direction of first semiconductor columns provided in even-numbered positions counting from the one side in the first direction, of the plurality of first semiconductor columns is assumed to be a second position, a position in the second direction of the plurality of second semiconductor columns is assumed to be a third position, a distance between the first position and the third position is assumed to be a first distance, and a distance between the second position and the third position is assumed to be a second distance, the first distance is larger than the first pitch, the second distance is larger than the first pitch, and the second distance is different from the first distance, wherein a distance in the first direction between center positions in the first cross section of two of the second semiconductor columns adjacent in the first direction is assumed to be the first adjacent distance, a center position in the first cross section of one of the first semiconductor columns provided in the odd-numbered positions counting from the one side in the first direction, of the plurality of first semiconductor columns is assumed to be a first center position, a center position in the first cross section of one of the first semiconductor columns provided in the even-numbered positions counting from the one side in the first direction, of the plurality of first semiconductor columns is assumed to be a second center position, a center position in the first cross section of one of the plurality of second semiconductor columns is assumed to be a third center position, a distance in the second direction between the first center position and the third center position is assumed to be the first distance, a distance in the second direction between the second center position and the third center position is assumed to be the second distance, the first distance is equal to $(\sqrt{3})/2$ times the first adjacent distance or is more than $(\sqrt{3})/2$ times the first adjacent distance, and the second distance is equal to $(\sqrt{3})/2$ times the first adjacent distance or is more than $(\sqrt{3})/2$ times the first adjacent distance.

18. The semiconductor memory device according to claim 17, wherein a difference between the first distance and the second distance is equal to $(\sqrt{3})/16$ times the first adjacent distance or more than $(\sqrt{3})/16$ times the first adjacent distance, and the difference between the first distance and the second distance is less than $(\sqrt{3})/8$ times the first adjacent distance.

* * * * *